United States Patent
Abajian et al.

(10) Patent No.: US 11,031,817 B2
(45) Date of Patent: Jun. 8, 2021

(54) COIL SELECTION IN MULTI-COIL WIRELESS CHARGING SYSTEM

(71) Applicant: Pi Inc., San Bruno, CA (US)

(72) Inventors: William Paul Abajian, Napa, CA (US); Jules Marie Xavier Laffitte, San Mateo, CA (US); John MacDonald, San Francisco, CA (US); Viswajit Natarajan, San Jose, CA (US); Lixin Shi, Redwood City, CA (US); Xiaoping Zhu, Moraga, CA (US)

(*) Notice: Subject to any disclaimer, the term of this patent is extended or adjusted under 35 U.S.C. 154(b) by 0 days.

(21) Appl. No.: 16/777,780

(22) Filed: Jan. 30, 2020

(65) Prior Publication Data
US 2020/0336018 A1    Oct. 22, 2020

Related U.S. Application Data

(60) Provisional application No. 62/834,919, filed on Apr. 16, 2019.

(51) Int. Cl.
| | |
|---|---|
| *H02J 50/10* | (2016.01) |
| *H02J 50/40* | (2016.01) |
| *H02J 7/02* | (2016.01) |
| *H02J 50/80* | (2016.01) |
| *G01R 23/16* | (2006.01) |
| *H02J 50/90* | (2016.01) |
| *H02J 50/12* | (2016.01) |
| *H01F 38/14* | (2006.01) |
| *H04B 5/00* | (2006.01) |

(52) U.S. Cl.
CPC .............. *H02J 50/10* (2016.02); *G01R 23/16* (2013.01); *H01F 38/14* (2013.01); *H02J 7/02* (2013.01); *H02J 50/12* (2016.02); *H02J 50/40* (2016.02); *H02J 50/402* (2020.01); *H02J 50/80* (2016.02); *H02J 50/90* (2016.02); *H04B 5/0037* (2013.01)

(58) Field of Classification Search
CPC .......... H02J 50/005; H02J 50/10; H02J 50/90; H02J 50/12; H02J 50/40; H02J 50/402; H02J 7/02; H02J 50/80; H01F 38/14; H04B 5/0037; G01B 23/16
See application file for complete search history.

(56) References Cited

U.S. PATENT DOCUMENTS

| | | |
|---|---|---|
| 2007/0085720 A1 | 4/2007 | Fosler |
| 2007/0120543 A1 | 5/2007 | Caldwell |

(Continued)

OTHER PUBLICATIONS

PCT/US2020/024738. International Search Report & Written Opinion (dated Aug. 12, 2020).

*Primary Examiner* — John W Poos
*Assistant Examiner* — Alex W Lam

(57) ABSTRACT

A wireless charging system is configured to charge one or more receiver devices simultaneously. The wireless charging system includes a plurality of coils for wireless charging the one or more receiver devices. The wireless charging system may use a machine learning algorithm to detect the one or more receiver devices and select which of the multiple coils to activate for charging the multiple coils. Based on measurements made from signal through the coils within the wireless charging system, the machine learning algorithm determines a subset of the coils to activate for charging the detected one or more receiver devices.

20 Claims, 15 Drawing Sheets

(56) References Cited

U.S. PATENT DOCUMENTS

| | | | |
|---|---|---|---|
| 2013/0300204 A1* | 11/2013 | Partovi | H02J 7/00302 307/104 |
| 2015/0002087 A1 | 1/2015 | Mack | |
| 2015/0115728 A1* | 4/2015 | Yamamoto | H02J 5/005 307/104 |
| 2015/0310722 A1* | 10/2015 | Sousa | H02J 7/025 307/104 |
| 2020/0091779 A1* | 3/2020 | Lee | H02J 50/40 |

* cited by examiner

500

Determine target characteristics of a coil driving signal
510

Select a frequency and a duty cycle associated with a pulse width modulation (PWM) signal based on the target characteristics
520

Generate the PWM signal based on the selected frequency and duty cycle
530

Provide the generated PWM signal as an input to a half-bridge inverter, the half-bridge inverter configured to generate the coil driving signal
540

Provide the generated coil driving signal to the coil
550

FIG. 5

COIL SELECTION IN MULTI-COIL WIRELESS CHARGING SYSTEM

CROSS-REFERENCE TO RELATED APPLICATIONS

The present application claims the benefit of U.S. Patent Application 62/834,919, which was filed Apr. 16, 2019, which is hereby incorporated by reference in its entirety. This application is also related to U.S. patent application Ser. No. 16/777,763, filed Jan. 30, 2020, U.S. patent application Ser. No. 16/777,768, filed Jan. 30, 2020 and U.S. patent application Ser. No. 16/777,777, filed Jan. 30, 2020.

TECHNICAL FIELD

The disclosure relates to wireless charging systems, and more particularly to multi-coil wireless charging systems.

BACKGROUND

With growing popularity of wireless devices, efficient wireless charging system for simultaneously charging a variety of wireless devices (e.g., cellphone, tablet, speaker, watch, headphones, IoT device) is useful. Having a single wireless charging system that can simultaneously charge multiple devices eliminates the inconvenience of managing multiple chargers.

A wireless charging system may be configured to charge multiple wireless devices simultaneously. The wireless charging system may include a charging surface on which wireless devices are placed to be charged. The wireless charging system may provide high degree of flexibility in the positioning of the devices on the charging surface by allowing devices to be placed at any location on the charging surface instead of restricting it to a specific location. However, because devices may be placed at different locations on the charging surface, it is challenging to determine how to drive the wireless charging system efficiently for all possible device placements. Additionally, some users cover their devices with protective cases or attach accessories such as phone stands or card holders to the back of their devices, which increases the distance between the charging surface of the wireless charging system and the receiver coils in the devices. Inductive charging used by wireless charging systems is based on distance between transmission coils and receiver coils, and the increase in distance between the transmission coils and the receiver coils adds another challenge for wireless charging systems because the coupling between the coils grows weaker with distance.

SUMMARY

A wireless charging system with multiple transmission coils allows for simultaneous charging of receiver devices by independently controlling each of the multiple transmission coils. The multiple transmission coils may be arranged in an array within the wireless charging system and each coil may be independently controlled by a coil drive system that outputs a driving signal to the coil. The driving signal may be selected based on target characteristics of the coil determined using a feedback system that includes one or more feedback channels. In some embodiment, a first feedback channel may be high precision measurements of voltage across the coils or current through the coils, and a second feedback channel may be communication signals from the receiver devices. Based on the first feedback channel and the second feedback channel, the wireless charging system determines how to drive a subset of the transmission coils for charging one or more receiver devices on the wireless charging system. The wireless charging system may detect the one or more receiver devices to be charged and select the subset of transmission coils for charging the detected one or more receiver devices, for example, using a machine learning algorithm.

BRIEF DESCRIPTION OF THE DRAWINGS

FIG. 5 is a flowchart illustrating a process of driving a coil, in accordance with an embodiment.

Figure 1:
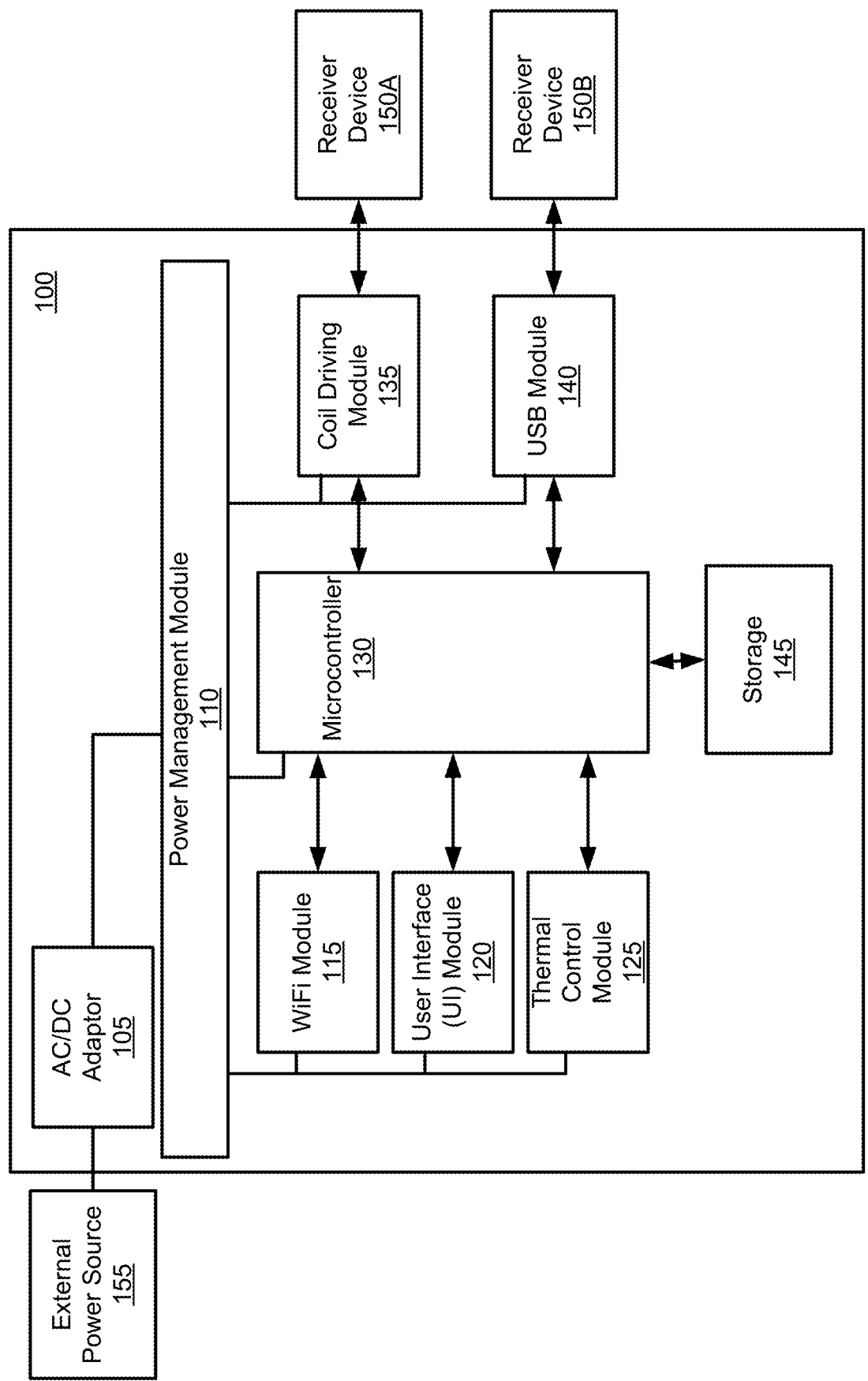
FIG. 1 is a system diagram of a wireless charging system, in accordance with an embodiment.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

The language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

Configuration Overview

A wireless charging system for charging one or more receiver devices includes a plurality of coils, where each coil is driven independently. Each coil receives a coil driving signal from a coil drive circuit, and the coil driving signal is generated based on target characteristics such as a target frequency, a target amplitude, and a target phase. Based on the target characteristics, a frequency and a duty cycle is determined for a pulse width modulation (PWM) that is provided as an input to a circuit that generates the coil driving signal as an output to a coil. The circuit may include a half-bridge inverter or a full-bridge inverter.

The wireless charging system may use a first feedback channel in detecting receiver devices. One of the feedback channels may be based on measurements of a signal in a coil of the plurality of coils made using an analog to digital converter (ADC). The sampling speed and digital Fourier transform size for the measurements is selected to avoid collisions of harmonic signals.

Another of the feedback channels may be demodulated communication signals from receiver devices being charged by the wireless charging system. The communication signals may be according to Qi standards. The current in the coils of the wireless charging system is a function of receiver load in the receiver devices, and the receiver devices encode the communication signals by varying the receiver load (e.g., by turning a switch that changes the receiver load ON and OFF). The wireless charging system analyzes the current in the coils of the wireless charging systems and demodulates the communication signals based on changes in the current. The wireless charging system further performs error correction on the demodulated communication signals for improving accuracy.

The wireless charging system detects one or more receiver devices and determines which subset of the plurality of coils to activate for charging the detected one or more receiver devices. The wireless charging system may use a machine learning algorithm to determine the subset of coils. The machine learning algorithm receives an input data vector based on signals from the plurality of coils and identifies a charging configuration based on the input data vector. The charging configuration identifies the subset of coils to be used in charging the one or more receiver devices.

Overview of Wireless Charging System

Referring now to Figure (FIG. 1, shown is a system diagram of a wireless charging system 100 in accordance with an example embodiment. The wireless charging system 100 includes an AC/DC adaptor 105 that is connected to a power management module 110. The AC/DC adaptor 105 is connected to an external power source 155 (e.g., wall plug) and converts alternating current (AC) from the external power source 155 into direct current (DC) for powering modules in the wireless charging system 100. Using the DC output from the AC/DC adaptor 105, the power management module 110 supplies power to a WiFi module 115, user interface (UI) module 120, a thermal control module 125, a microcontroller 130, a coil driving module 135, a universal serial bus (USB) module 140 of the wireless charging system 100, and a storage 145. It is noted that in alternative embodiments, different and/or additional components may be included in the system.

The WiFi module 115 connects with a data cloud for additional control and analytical functionalities that may not be performed by a less sophisticated microcontroller 130 that has limited computing power. The WiFi module 115 may include a WiFi controller that manages communication between the microcontroller 130 and the cloud. The WiFi module 115 may connect to the cloud via a WiFi antenna.

The UI module 120 manages interactions between a user and the wireless charging system 100 by receiving signals from a user and sending the signals to the microcontroller 130 and receiving signals from the microcontroller 130 and sending the signals to the user. The UI module 120 may include input hardware such as a button, a switch, a microphone, a touch interface, and the like that the user may interact with to provide input to the microcontroller 130. The wireless charging system 100 may also include output hardware such as LEDs, a speaker, a display screen, and the like to communicate a message to the user. For example, the UI module 120 may cause a light emitting diode (LED) to be in a state to flash or remain in a green light when charge is complete for a device connected to the wireless charging system 100, be in a state to flash or remain in a red light when charging, and be in a state to blink rapidly in a red light when there is an error.

The thermal control module 125 monitors temperature of the wireless charging system 100 to ensure safe operating conditions for the wireless charging system 100. The thermal control module 125 may include temperature monitoring sensors such as thermistors to determine when a temperature of the wireless charging system 100 exceeds a threshold that represents a safe temperature for the wireless charging system 100. The thermistors may be connected to the microcontroller 130, and the microcontroller 130 determines the temperature of the wireless charging system 100 based on resistance in the thermistors. The thermal control module 125 may include a fan controlled by the microcontroller 130. When the microcontroller 130 determines that the temperature exceeds the threshold, the microcontroller 130 may activate the fan until the temperature returns to below the safe threshold.

The microcontroller 130 may be configured to automatically control the WiFi module 115, UI module 120, the thermal control module 125, the coil driving module 135, and the USB module 140. The microcontroller 130 may be an integrated circuit chip with one or more central processing units (CPUs), memory, and input/output ports that provides instructions to its connected modules. The microcontroller 130 can be any controller or processor for executing program instructions which include states. The instructions may be stored in a machine-readable medium. The instructions may also reside, completely or at least partially, within a memory within the microcontroller 130 or stored in a cloud and transmitted to the microcontroller 130 over a network.

The coil driving module 135 includes a coil that charges a receiver device 150A using wireless power transfer and a control system for the coil. The coil driving module 135 measures voltage and current signals in the coil to detect the receiver device 150A that is on a charging surface of the wireless charging system 100 and provides the voltage and current signals to the microcontroller 130. The microcontroller 130 determines how to control the coil for effectively transferring power to the detected receiver device 150A based on the received signals. The coil driving module 135 and the microcontroller 130 operate as a dynamic feedback system for charging the receiver device 150A. The interaction between the coil driving module 135 and the controller 130 is described in detail below with respect to FIG. 2. Although not shown in FIG. 1, the wireless charging system 100 may include a plurality of coils for wirelessly charging one or more devices. In some embodiments, there may be a separate coil driving module 135 for each of the plurality of coils. In other embodiments, there may be a coil driving module 135 that controls one or more coils.

The USB module 140 includes USB-standard circuits to deliver power to a receiver device 150B using one or more USB cables. In addition to wirelessly charging devices, the USB module 140 allows the wireless charging system 100 to charge additional devices that may not be compatible with wireless power transfer or when there is a maximum number of devices on the charging surface of the wireless power transfer method. The USB module 140 may include a data line for data transfer, e.g., firmware updated for the wireless charging system 140.

The storage 145 includes a machine-readable medium on which is stored instructions embodying any one or more of the methodologies or functions described herein. The instructions (e.g., software) may also reside, completely or at least partially, within a memory in the microcontroller 130 or within a cloud and transmitted over a network. The term "machine-readable medium" can include a single medium or multiple media (e.g., a centralized database, or associated caches and servers) able to store instructions. The term "machine-readable medium" should also be taken to include any medium that is capable of storing instructions for execution by a machine and can cause the machine to perform any one or more of the methodologies disclosed herein.

Example Microcontroller and Coil Driving Module

Figure 2:
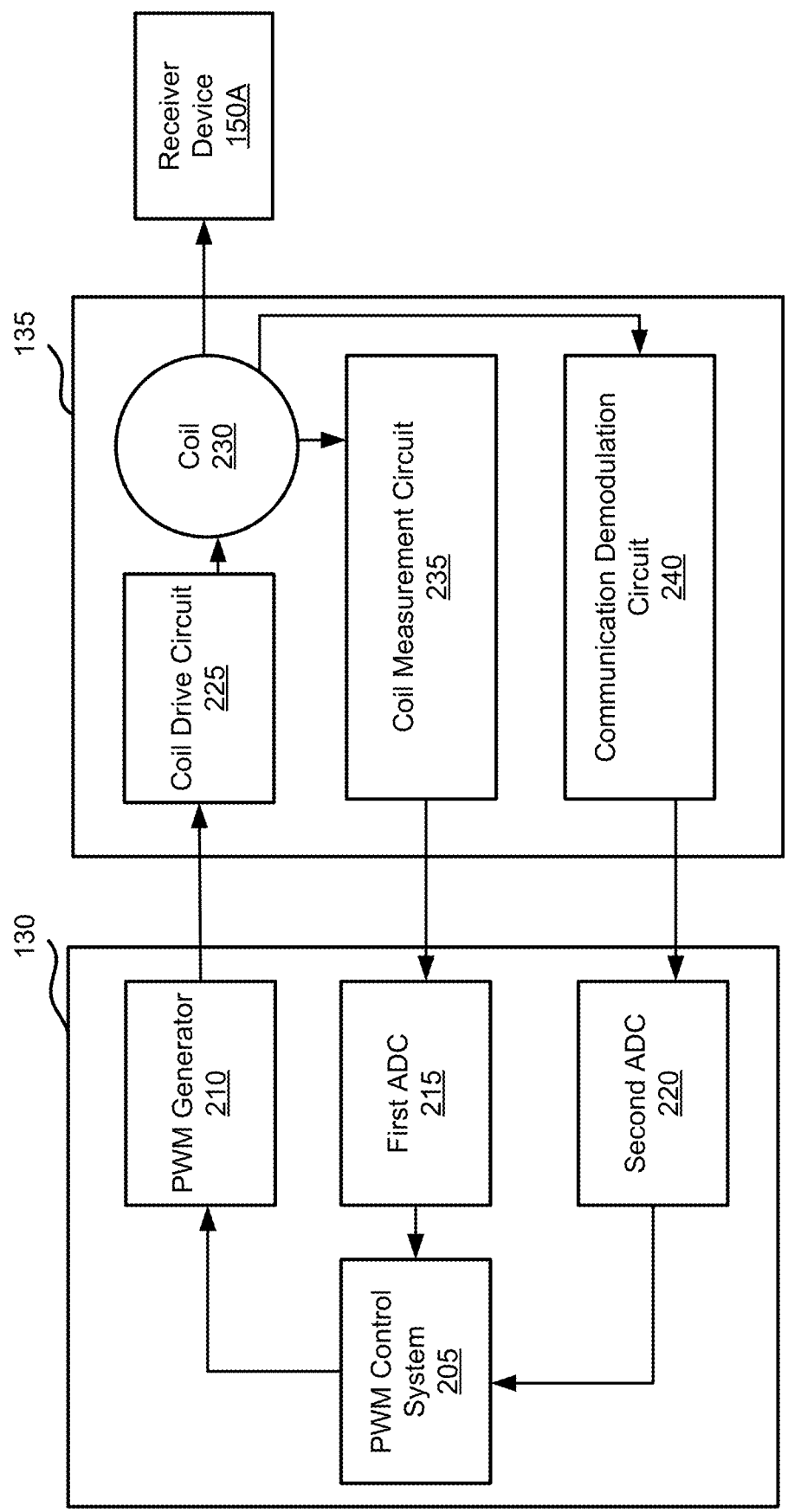
FIG. 2 is a system diagram of a microcontroller and a coil driving module of FIG. 1, in accordance with an embodiment.

FIG. 2 is a system diagram of a microcontroller 130 and a coil driving module 135 of FIG. 1, in accordance with an example embodiment. Although FIG. 2 focuses on interactions between the microcontroller 130 and the coil driving module 135, the microcontroller 130 is connected to additional modules and controls the additional modules as shown in FIG. 1. Additionally, FIG. 2 only shows an interaction between one coil driving module 135 and the microcontroller 130. However, the wireless charging system 100 may include an array of coils, and each coil in the array may be driven by a different coil driving module 135. The plurality of coil driving modules 135 are controlled by the microcontroller 130. In alternative embodiments, different and/or additional components may be included in the microcontroller 130 and/or the coil driving module 135 and more than one receiver device 150A may be connected to the coil driving modules 135.

The microcontroller 130 includes a pulse width modulation (PWM) controller system 205, a PWM generator 210, a first analog to digital converter (ADC) 215, and a second ADC 220. The microcontroller 130 is connected to the coil driving module 135 that includes a coil drive circuit 225, a coil 230, a coil measurement circuit 235, and communication demodulation circuit 240. Based on positions of the receiver devices 150A on the charging surface of the wireless charging system 100, the microcontroller 130 selects a subset of coils 230 to send driving signals to. The selected subset of coils 230 are supplied with a PWM signal to wirelessly charge the receiver devices 150A using inductive charging. The microcontroller 130 and the coil driving module 135 form a feedback control system for selecting a particular subset of coils 230 in the wireless charging system 100 and providing signals to the selected coils 230. In alternative embodiments, the PWM controller system 205 and the ADCs (e.g., first ADC 215 and the second ADC 220) may be external to the microcontroller 130 and are controlled by the microcontroller 130.

The coil drive circuit 225 receives a PWM waveform from the PWM generator 210 and generates a voltage signal for driving the coil 230. The coil measurement circuit 235 measures amplitudes and phases of voltage and a current in the coil 230 and the measurements are provided to a first ADC converter 215 of the microcontroller 130 and fed into the PWM control system 205 as an input to a control algorithm that determines how to select a PWM signal to be generated by the PWM generator 210.

The coil driving module 135 also includes a communication demodulation circuit 240 that demodulates signals from the receiver device 150A by analyzing changes in current running through the coil 230. The current in the coil 230 is a function of load in the receiver device 150A, and the load varies based on communication signal. By monitoring the change in current in the coil 230, the communication signal from the receiver device 150A can be demodulated. The communication demodulation circuit 240 receives the current from the coil 230 for demodulation and the demodulated signal is sent to the second ADC 220. Once the ADC 220 converts the demodulated signal in alternating current (AC) form into direct current (DC) form, the demodulated signal is provided as an input to the PWM control system 205 for driving the coils 230 to use in charging the receiver device 150A. In other embodiments, the communication demodulation circuit 240 may analyze changes in voltage across the coil 230 instead of current or in addition to current.

Example Coil Drive Circuit

The coil drive circuit 225 is connected to the PWM generator 210 that supplies a PWM waveform to the coil drive circuit 225. Given a target operating frequency $f_{op}$, a target RMS voltage amplitude V, and a target phase θ, the coil drive circuit 225 outputs a voltage waveform Vres to the coil 230. The coil drive circuit 225 may be a DC to AC inverter that outputs the sinusoidal voltage waveform Vres used by the coil 230 for generating power for charging the receiver device 150A. The coil drive circuit 225 receives a DC power source Vdd from the power management module 110.

One possible approach for implementing the coil drive circuit 225 is to use a two-stage inverter design. A first stage may be a DC to DC converter that determines the amplitude V of the voltage waveform Vres, and a second stage may be a DC to AC inverter for controlling the frequency $f_{op}$. However, this approach requires a complex circuit structure, which can be expensive for implementing. Instead, simpler circuit structures such as a half-bridge inverter or a full-bridge inverter may be used instead to reduce the circuit complexity and cost. Despite using simpler circuit structures, the coil drive circuit 225 may achieve a same range and flexibility of control as using the two-stage inverter design by selecting the appropriate control signals. The half-bridge inverter approach is described below with respect to FIGS. 3A and 3B, and the full-bridge inverter approach is described with respect to FIG. 4.

Figure 3A:
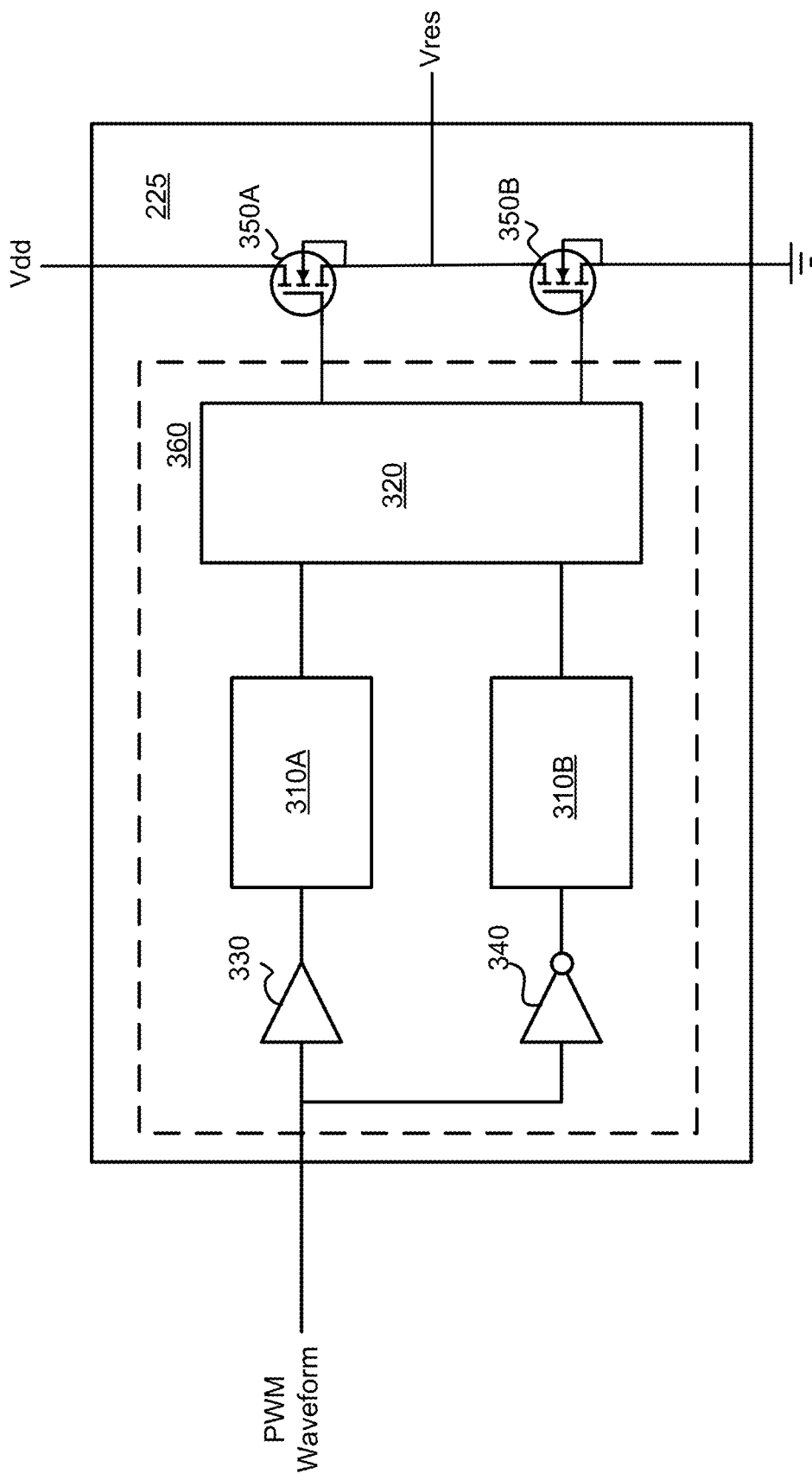
FIG. 3A is a first example of a coil drive circuit, in accordance with an embodiment.

FIG. 3A is a first example of a coil drive circuit 225, in accordance with an embodiment. The coil drive circuit 225 includes a half-bridge driver 360 that controls a first transistor 350A and a second transistor 350B. The coil drive circuit 225 may be a half-bridge inverter that includes a buffer 330 connected to a first deadtime control circuit 310A that connects to a gate driver 320. The PWM waveform is passed through the buffer 330 and the first deadtime control system 310A and provided to the gate driver 320 as a first input. The coil drive circuit 225 also includes an inverter 340 connected to a second deadtime control system 310B that connects to the gate driver 320. The PWM waveform is passed through the buffer 330 and the second deadtime control circuit 310B and provided to the gate driver 320 as a second input. The gate driver 320 provides a first gate signal to the first transistor 350A and a second gate signal to the second transistor 350B.

The PWM waveform is a discrete signal that switches between an on state and an off state at a frequency $f_{pwm}$, and a proportion of a time that the PWM waveform is at the on state and a time that the PWM waveform is at the off state during a period is controlled by a duty cycle $\eta_{pwm}$. To control the output voltage waveform Vres for driving the coil 230, the frequency $f_{pwm}$, the duty cycle $\eta_{pwm}$, and the phase $\varphi_{pwm}$ of the PWM waveform that is provided to the coil drive circuit 225 is selected based on target characteristics of the voltage waveform Vres. The target characteristics may include the target operating frequency $f_{op}$, the target RMS voltage amplitude V, and the target phase θ.

In some embodiments, the frequency of the PWM waveform $f_{pwm}$ is set to be $$f_{PWM} = f_{op} \quad \text{(Equation 1)}$$

and the duty cycle $\eta_{pwm}$ of the PWM waveform is set to be $$\eta_{pwm} = \frac{1}{\pi}\arcsin\left(\frac{\pi}{2}\cdot\frac{V}{Vdd}\right) + (\tau_{dr} - \tau_{df})f_{op} \quad \text{(Equation 2)}$$

where $\tau_{dr}$ is the delay time of the rising edge of the output waveform, and $\tau_{df}$ is the delay time of the falling edge.

The phase of the center of the PWM waveform $\varphi_{pwm}$ is set to be the target phase θ of Vres, or the phase of the rising edge of the PWM waveform is set to be $$\varphi_{pwm} = \theta + \eta_1\pi + 2\pi\tau_{dr}f_{op} \quad \text{(Equation 3)}$$

In some embodiments, when the target frequency $f_{op}$ is high, a duration of turn-on time (e.g., time at which the PWM waveform is at the on state) is too short for the coil control circuit 225 if the frequency of the PWM waveform $f_{pwm}$ is set to be equal to the target frequency $f_{op}$. To effectively charge the receiver device 150A, frequency of the PWM waveform $f_{pwm}$ is set to be a fraction of the target frequency $f_{op}$, such that the frequency of the PWM waveform $f_{pwm}$ is equal to the target frequency $f_{op}$ divided by an integer n (i.e., the target frequency $f_{op}$ is a harmonic frequency of $f_{PWM}$). Setting the frequency of the PWM waveform $f_{pwm}$ to be a lower frequency value increases the duration of turn-on time and improves the performance of the coil control circuit 225 by providing a higher resolution in controlling the target RMS voltage amplitude V of Vres. Additionally, there are lower switching losses from the first transistor 350A and the second transistor 350B.

To determine whether to set the frequency of the PWM waveform to be equal to the target frequency $f_{op}$ or to be equal to a fraction of the target frequency, the PWM control system 205 may first calculate the duty cycle $\eta_{pwm}$ according to Equation 2. The calculated duty cycle $\eta_{pwm}$ is compared to a predetermined threshold value, and if the calculated duty cycle $\eta_{pwm}$ is smaller than the threshold value, the PWM control system 205 determines that the frequency of the PWM waveform $f_{pwm}$ should be a fraction of the target frequency $f_{op}$. The predetermined threshold value may be determined by implementation limitations and other design requirements, for example, the minimum turn-on time of the gate driver 320, or limit on electromagnetic radiations as narrow pulses generate higher harmonic components. In some embodiments, the maximum frequency of the target frequency $f_{op}$ may be a second harmonic of the target frequency $f_{op}$.

The target frequency $f_{op}$ is selected to be the n-th harmonic of $f_{PWM}$ when the following condition is satisfied:

$$\frac{V}{Vdd} \leq \frac{2}{n\pi} \quad \text{(Equation 4)}$$

When $f_{op}$ is the n-th harmonic, such that $$f_{PWM\_n} = \frac{1}{n}f_{op} \quad \text{(Equation 5)}$$

the duty cycle $\eta_{pwm\_n}$ is set to be $$\eta_{pwm\_n} = \frac{1}{n\pi}\arcsin\left(\frac{n\pi}{2}\cdot\frac{V}{Vdd}\right) + (\tau_{dr} - \tau_{df})\frac{f_{op}}{n} \quad \text{(Equation 6)}$$

The phase of the center of the PWM waveform $f_{pwm\_n}$ is set to be the target phase θ of Vres, or the phase of the rising edge of the PWM waveform $f_{pwm\_n}$ is set to be $$\varphi_{pwm\_n} = \theta + \eta_{pwm\_n}\pi + \frac{2\pi}{n}\tau_{dr}f_{op} \quad \text{(Equation 7)}$$

When the value of $\eta_{pwm\_n}$ is small, for example, when $$\frac{nV}{V_{dd}}$$

is less than 0.4, $\eta_{pwm\_n}$ can be approximated as $\eta_{pwm\_n} \approx \eta_{pwm}$. Otherwise, the approximation does not hold, and to use a high harmonic frequency as the target frequency $f_{op}$ of Vres to drive the coil 230, the duty cycle $\eta_{pwm}$ has to be increased. This prevents the target frequency from $f_{op}$ from being arbitrarily high.

Figure 3B:
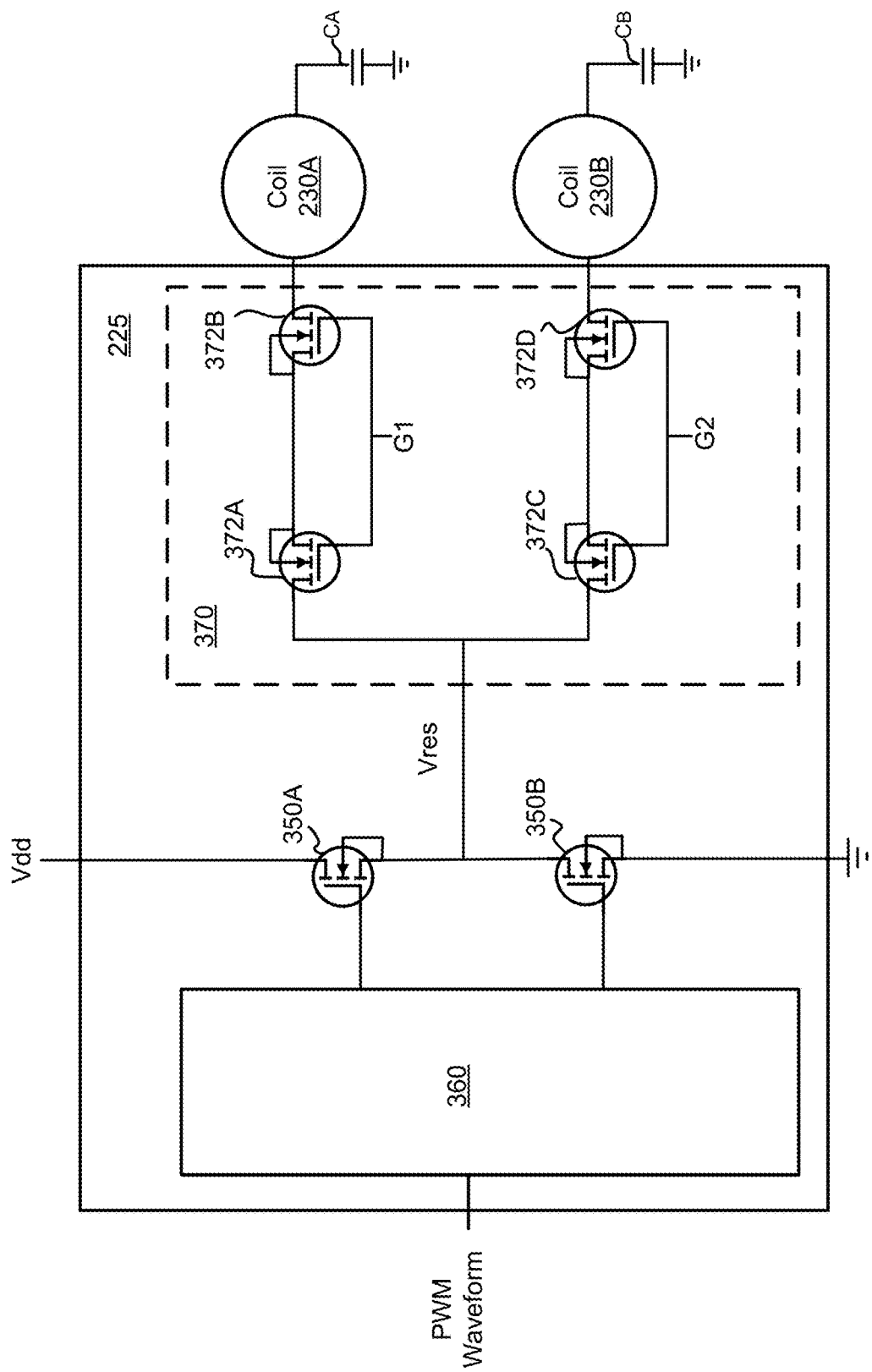
FIG. 3B is a second example of a coil drive circuit including a load switch, in accordance with an embodiment.

FIG. 3B is a second example of a coil drive circuit including a load switch, in accordance with an embodiment. In the first example discussed with respect to FIG. 3A, each coil drive circuit 225 drives a single coil. However, because the wireless charging system 100 drives a subset of coils 230 at a given time instead of driving all of the coils 230 at the same time, a coil drive circuit 225 may configured to drive a plurality of coils 230 using a load switch. The load switch may allow the coil drive circuit 225 to switch between driving different coils 230 connected to the coil drive circuit 225. For example, the wireless charging system 100 may include M coils 230, but only N coils 230 may be turned on at any given time, where N<M. Given these conditions, a cross-bar system may be created between the coil drive circuits 225 and the coils 230. The load switch may be added to pairs of drivers and coils, wherever appropriate.

In the wireless charging system 100, there are a plurality of coils 230 for charging a plurality of receiver devices 150A. Depending on parameters such as a number of detected receiver devices 150A and positions of the detected receiver devices 150A, the wireless charging system 100 drives a particular subset of coils 230 for charging the detected receiver devices 150A. When the plurality of coils 230 are arranged to overlap each other or arranged to be in proximity to each other within the wireless charging system 100, there can be unwanted induced current due to cross-talk between neighboring coils, which can lead to lowered efficiency due to undesirable power loss as well as inaccurate communication signals. For example, the wireless charging system 100 may detect a receiver device and select a first coil for charging the detected device. When the wireless charging system 100 drives the first coil, current through the first coil may induce current in a neighboring second coil that is not intended to be driven for charging the detected device. In some embodiments, to avoid the unwanted cross-talk, induced current may be suppressed using a load switch that turns off coils that are not being driven by a coil drive circuit 225. The addition of the load switch can improve efficiency and accuracy in communication signal detection.

In the second example shown in FIG. 3B, the coil drive circuit 225 includes a load switch 370 that drives a first coil 230A and a second coil 230B. In some embodiments, the first coil 230A and the second coil 230B may be overlapping. In some embodiments, the first coil 230A and the second coil 230B may be concentric coils with different diameters. Depending on the position of the receiver device 150A on the charging surface of the wireless charging system 100, coils of different diameters may be selected for charging the receiver device 150A to optimize power delivery efficiency. In the embodiment shown in FIG. 3B, there are two coils connected to the coil drive circuit 225, but in other embodiments, there may be more than two coils. The half-bridge driver 360 receives a PWM waveform from the PWM generator 210 and controls the first transistor 350A and the second transistor 350B. The load switch 370 is connected to a node between the first transistor 350A and the second transistor 350B. The load switch 370 introduces back to back transistors in series between the node and the coils 230A and 230B, which effectively blocks induced current from flowing through a coil that is not being driven.

The load switch 370 includes a third transistor 372A and a fourth transistor 372B connected to the first coil 230A and includes a fifth transistor 372C and a sixth transistor 372D connected to the second coil 230B. The third transistor 372A and the fourth transistor 372B connected to the first coil 230A are in a first branch of the load switch 370, and the fifth transistor 372C and the sixth transistor 372D connected to the second coil 230B are in a second branch parallel to the first branch. The third transistor 372A and the fourth transistor 372B are connected to a first gate driving signal G1, and the fifth transistor 372C and the sixth transistor 372D are connected to a second gate driving signal G2. Although not shown in FIG. 3B, the first gate driving signal G1 and the second gate driving signal G2 may be generated by the microcontroller 130 and provided to the respective transistors. The first gate driving signal G1 and the second gate driving signal G2 are generated such that when one of the driving signals is on, the other driving signal is off. Although both of the driving signals may be off at the same time, both of the driving signals cannot be on at the same time.

In some embodiments, the first coil 230A is connected in series with a first capacitor $C_A$, and the combination of the first coil 230A and the first capacitor $C_A$ forms a LC filter. The first coil 230A and the first capacitor $C_A$ are selected such that the resonant frequency of the LC filter is similar to (e.g., within 10% of) or equal to a switching frequency of the first transistor 350A and the second transistor 350B. When the resonant frequency condition is met, an AC current is produced in the first coil 230A and the first capacitor $C_A$, and the AC current generates a magnetic field when passing through the first coil 230A. Similarly, the second coil 230B may be connected in series with a second capacitor $C_A$, and the combination of the components may be selected such that their resonant frequency is similar to or equal to the switching frequency of the first transistor 350A and the second transistor 350B.

Figure 4:
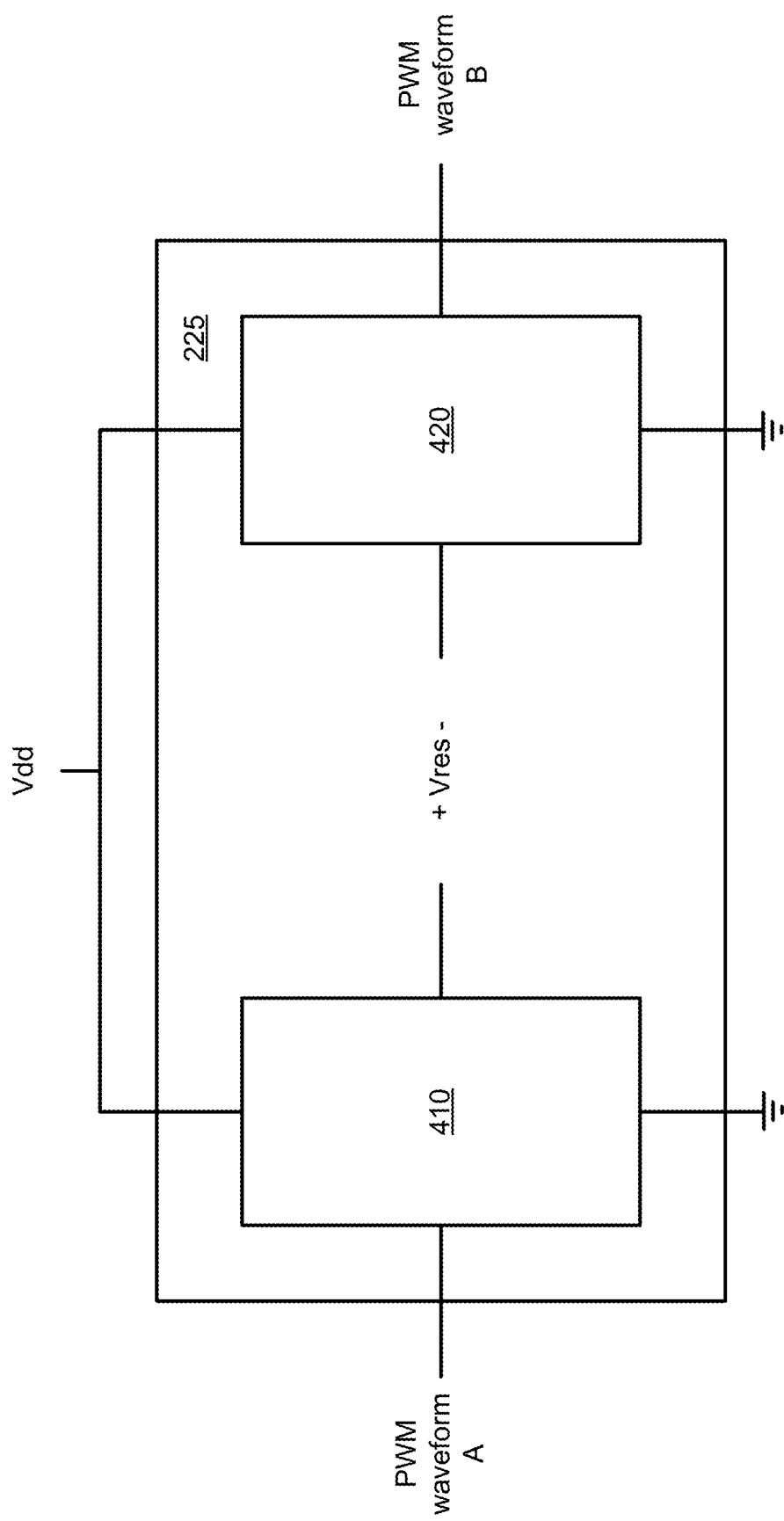
FIG. 4 is a third example of a coil drive circuit, in accordance with an embodiment.

FIG. 4 is a third example of a coil drive circuit 225, in accordance with an embodiment. In the third example, the coil drive circuit 225 is a full-bridge inverter that includes a first half-bridge 410 and a second half-bridge 420. The first half-bridge 410 and the second half-bridge 420 receive a DC power source Vdd from the power management module 110. Although not shown, similar to the second example, the coil drive circuit 225 including the full-bridge inverter may include a load switch and be configured to drive more than one coil.

The first half-bridge 410 receives PWM waveform A and the second half-bridge 420 receives PWM waveform B. PWM waveform A and PWM waveform B are generated by the PWM generator 210 based on instructions from the PWM control system 205. The duty cycles of both PWM waveform A and PWM waveform B may be set to be 50%. PWM waveform A and PWM waveform B may have a phase offset of α degrees in between, such that PWM waveform A leads PWM waveform B by α degree, or vice versa. Across the first half-bridge 410 and the second half-bridge 420, the coil drive circuit 225 outputs the voltage waveform Vres.

To control the target operating frequency $f_{op}$, the target amplitude V, and the target phase θ of the output voltage wave form Vres, the frequency of PWM waveform A and PWM waveform B may be set to be equal to the target operating frequency $f_{op}$ according to Equation 1. The phase offset of α between PWM waveform A and PWM waveform B is set to $$\alpha = 2\arcsin\left(\frac{\pi}{2\sqrt{2}} \frac{V}{V_{dd}}\right) + (\tau_{dr} - \tau_{df})f_{op} \qquad \text{(Equation 8)}$$

where $\tau_{dr}$ is the delay time of the rising edge of the voltage waveform Vres, and $\tau_{df}$ is the delay time of the falling edge of the voltage waveform Vres. The phase of the rising edge of LH_PWM to be $$\varphi_1 = \theta + \frac{\alpha}{2} + 2\pi\tau_{dr}f_{op} \qquad \text{(Equation 9)}$$

FIG. 5 is a flowchart illustrating a process 500 of driving a coil, in accordance with an example embodiment. The coil is in a wireless charging system that provides wireless power transfer to a receiver device. To drive the coil, the wireless charging system determines 510 target characteristics of a coil driving signal. The wireless charging system selects 520 a frequency and a duty cycle associated with a pulse width modulation (PWM) signal based on the target characteristics. Based on the selected frequency and duty cycle, the wireless charging system generates 530 the PWM signal. The generated PWM signal is provided 540 as an input to a half-bridge inverter, the half-bridge inverter configured to generate the coil driving signal. The generated coil driving signal is provided 550 to the coil.

Example Feedback System

As shown in FIG. 2, the feedback system between the microcontroller 130 and the coil driving module 135 includes two feedback channels. In a first feedback channel, measurements from the coil measurement circuit 235 is provided to the first ADC 215. The first feedback channel is discussed in detail with respect to FIGS. 6 and 7. In a second feedback channel, communication signal from the receiver device 150A is determined by the communication demodulation circuit 240 and provided to the second ADC 220. The communication signal may be according to a communication protocol such as the Qi standard. The second feedback channel is discussed in detail with respect to FIGS. 8-10. Signals from the first ADC 215 and the second ADC 220 are used by the PWM control system 205 to generate a PWM signal in the PWM generator 210 used to drive coils 230 that charge the receiver devices 150A.

Example High-Precision Measurement System

The wireless charging system 100 measures amplitudes and phases of voltage across and current going through the coils 230 and uses the measurements as the first feedback channel. When a receiver device 150A is placed in close proximity of the coils 230, the receiver device 150A loads the coils 230 and causes a change in the voltages and currents of the coils 230. By monitoring the change in the voltages and the currents of the coils 230, the wireless charging system 100 can detect and track the receiver device 150A. The wireless charging system 100 may make measurements of the amplitude and phase of the voltage and current at predetermined intervals (e.g., every 50 ms) and use the change in the measurements of the coils 230 to detect the presence of one or more receiver devices 150A. As described with respect to FIGS. 12-14, the measurements may be provided as an input to a machine learning algorithm to determine a number of receiver devices 150A, a position of the receiver devices 150A on the charging surface of the wireless charging system 100, and a subset of coils in the wireless charging system 100 to activate to charge the detected receiver devices 150A. Once the subset of coils to activate is determined, the PWM control system 205 may determine how to drive the subset of coils such that the detected receiver devices 150A may charge the identified receiver devices 150A efficiently.

To reduce costs of manufacturing the wireless charging system 100, a low speed ADC (e.g., the first ADC 215) may be used. However, the AC signals in the coils 230 may be high speed signals, and the low speed ADC may not be able to obtain sufficient samples needed to collect accurate measurements. When there may not be enough samples per period due to undersampling in the time domain, there is aliasing in the frequency domain that causes multiple frequency components to overlap on top of each other. When there is aliasing, it may be impossible to separate the different frequency components and accurately reconstruct the overlapping frequency components. However, because the operating frequency $f_{op}$ of the coils 230 are known, a digital signal selection algorithm may be used to select an ADC sampling speed $f_s$ and a discrete Fourier transform (DFT) size N to avoid collisions of harmonic signals. This allows the microcontroller 130 to make high-precision measurements of signals in the coils 230 despite limitations in the ADC.

Figure 6:
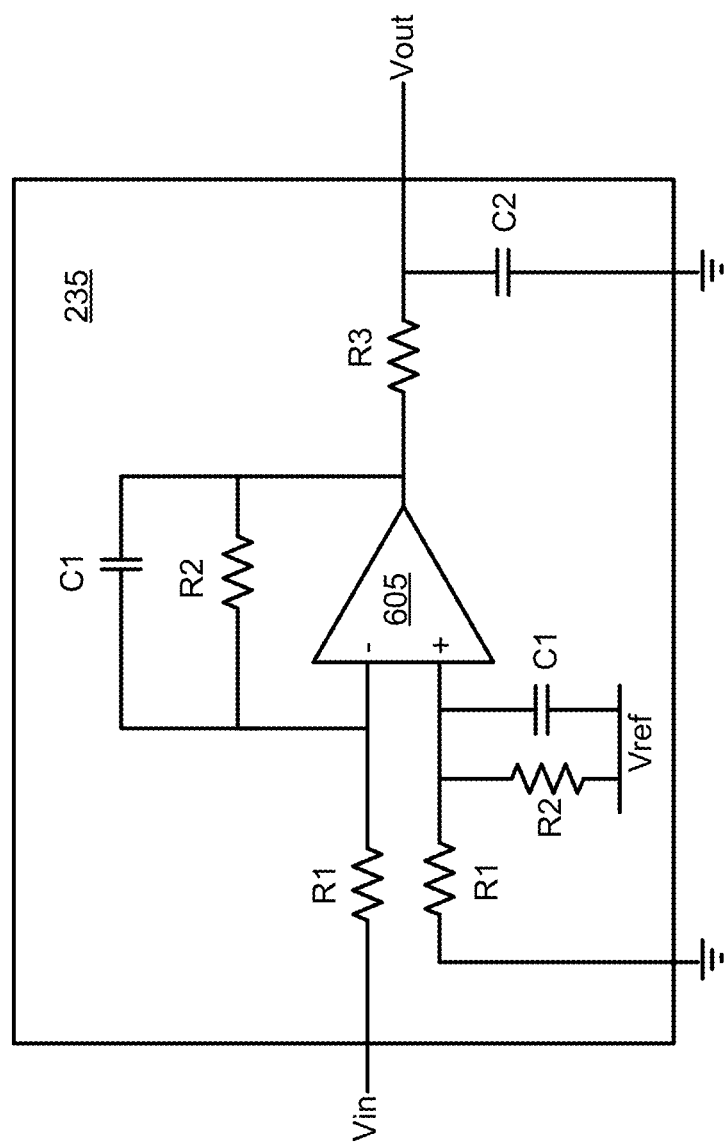
FIG. 6 is an example of a coil measurement circuit, in accordance with an embodiment.

FIG. 6 is an example of a coil measurement circuit 235, in accordance with an example embodiment. The coil measurement circuit 235 translates the input voltage Vin from the coil 230 into an output voltage Vout that is compatible with the first ADC 215. The coil measurement circuit 235 filters, biases, and scales the input voltage Vin for the first ADC 215. The output voltage Vout is then provided as input to the first ADC 215 to be sampled.

In some embodiments, the coil measurement circuit 235 includes an operational amplifier (op-amp) 605 that is connected to the input voltage Vin as an inverting input (−) through a first resistor R1. The coil measurement circuit 235 includes an active low pass filter that is implemented by connecting a second resistor R2 and a first capacitor C1 in parallel across the inverting input and the output voltage Vout. The non-inverting input (+) is connected to ground through a first resistor R1 and connected to a reference voltage Vref through a parallel network of a second voltage R2 and a first capacitor C1. At the output of the op-amp 605, a third resistor R3 and a second capacitor C2 are connected in series. The output voltage Vout is measured across the second capacitor C2.

The following equation represents the output voltage Vout at frequency ω, $$V_{out} = \frac{\left(V_{ref} - \frac{\left(\frac{1}{R_2} + j\omega C_1\right)^{-1}}{R_1} V_{in}\right)}{j\omega C_2 R_3 + 1} \quad \text{(Equation 10)}$$

If ω is far below the cut-off frequency of the low pass filter, the output voltage Vout may be approximated as, $$V_{out} \approx V_{ref} - \frac{R_2}{R_1} V_{in} \quad \text{(Equation 11)}$$

The coil measurement circuit 235 provides the output voltage Vout to the first ADC 215. The first ADC 215 samples the output voltage Vout and converts the analog signal to a digital signal.

For the following embodiments of the digital signal selection algorithm, the relationship between the sampling frequency $f_s$ and the operating frequency $f_{op}$ of the coil 230 is defined as $$\frac{b}{a} \triangleq \frac{f_s}{f_{op}}, \text{ where } gcd(a, b) = 1 \quad \text{(Equation 12)}$$

Because the clock of the first ADC 215 and the clock of the PWM control system 205 used to generate the signal in the coil 230 are from a same crystal or oscillator driving the microcontroller 130, the relationship of $$\frac{f_s}{f_{op}}$$

is a rational number. Then, the DFT size N is selected to be a multiple of b. When the DFT size N is not a multiple of b, the operating frequency $f_{op}$ does not have an integer index after performing the DFT. After performing the DFT, the k-th harmonic of the operating frequency $f_{op}$ collides with k+b, k+2b, . . . k+nb, where n is an integer value greater or equal to 1.

In a first embodiment, the sampling frequency $f_s$ of the first ADC 215 is selected out of all the discrete sampling speed options of the first ADC 215. The sampling frequency $f_s$ is defined by:

$$f_s = \text{argmax}\left\{b; \frac{b}{a} \triangleq \frac{f_s}{f_{op}}, \text{ where } gcd(a, b) = 1\right\} \quad \text{(Equation 13)}$$

where gcd is a function representing the greatest common divisor of two integers.

By choosing the sampling frequency $f_s$ according to Equation 13, the operating frequency $f_{op}$ of the coil 230 collides with harmonics with indices as large as possible with intensities as small as possible. This results in minimal distortion to the operating frequency $f_{op}$.

After selecting the sampling frequency $f_s$, a DFT size of N is selected to be the biggest multiple of b that is allowed by memory size and computational power of the microcontroller 130 used for performing the DFT. Based on the selected DFT size N, the first ADC 215 samples the output voltage Vout and collects N samples $\{a_0, a_1, \ldots, a_{N-1}\}$.

The Fourier value c is determined by performing DFT on the N samples $\{a_0, a_1, \ldots, a_{N-1}\}$:

$$c = \sum_{i=0}^{N-1} a_i e^{-\frac{j2\pi i a}{b}} \quad \text{(Equation 14)}$$

The RMS amplitude and phase of the output voltage Vout are calculated:

$$V_{RMS} = \sqrt{2}|c| \quad \text{(Equation 15)}$$

$$\theta = \angle c \quad \text{(Equation 16)}$$

The first embodiment discussed above requires the DFT size N to be a multiple of b, which can be impractical as b can be a large value that exceeds a maximum DFT size limited by memory size and computational power of the microcontroller 130.

In a second embodiment of the digital signal selection algorithm, the DFT size N is selected to be less than b. However, when the DFT size N is less than b, the digital signal selection algorithm is sensitive to windowing effect and can result in spectral leakage. Therefore, the DFT size N is selected to be less than a maximum DFT size $N_{max}$ of the first ADC 215 while minimizing the windowing effect.

First, a frequency index k is defined by:

$$k = \frac{aN}{b} \quad \text{(Equation 18)}$$

The frequency index k may be an integer or a non-integer.

When the frequency index k is a non-integer value, the frequency spectrum is convolved with a sin c function. The sin c function is zero at each integer point and reaches local maxima at halfway between adjacent integers (e.g., an integer plus 0.5), and to minimize windowing effect when performing the DFT, the fractional part of k $k_{frac}$ needs to be minimized. The fractional part of k $k_{frac}$ is defined by:

$$k_{frac} = \begin{cases} k - \lfloor k \rfloor, & \text{if } k - \lfloor k \rfloor \leq 0.5 \\ \lceil k \rceil - k, & \text{if } \lceil k \rceil - k < 0.5 \end{cases} \quad \text{(Equation 19)}$$

The smallest $k_{frac}$ of $$\frac{1}{b}$$

is achieved when $$aN \equiv 1 \pmod{b}$$

and the second smallest $k_{frac}$ of $$\frac{2}{b}$$

is achieved when $$aN \equiv 2 \pmod{b}$$

and the i-th smallest kfrac of $$\frac{i}{b}$$

is achieved when $$aN \equiv i \pmod{b}$$

Therefore, the DFT size N that is less than the maximum DFT size $N_{max}$ is selected to minimize $k_{frac}$. Given the DFT size N, the sampling frequency $f_s$ is selected from all discrete sampling speed options based on the following:

$$f_s = \text{argmax} \left\{ \frac{b}{gcd(a, gcd(N, b))}; \frac{b}{a} \triangleq \frac{f_s}{f_{op}}, \text{ where } gcd(a, b) = 1 \right\} \quad \text{(Equation 20)}$$

The first ADC 215 is used to perform a sampling of the output voltage Vout and collect N samples $\{a_0, a_1, \ldots, a_{N-1}\}$. The Fourier value c, the RMS amplitude $V_{RMS}$, and the phase $\theta$ are determined based on Equations 14, 15, and 16, respectively.

In a third embodiment, an ADC parameter A is calculated for selecting the sampling frequency $f_s$ of the first ADC 215. For each possible sampling frequency $f_s$ of the first ADC 215, the following is determined:

$$\frac{b}{a} \triangleq \frac{f_s}{f_{op}}, \text{ where } gcd(a, b) = 1 \quad \text{(Equation 12)}$$

If b is less than maximum DFT size $N_{max}$, the DFT size N is set to $$N = N_{max} - (N_{max} \bmod b) \quad \text{(Equation 21)}$$

Otherwise, if b is greater or equal to the maximum DFT size $N_{max}$, the DFT size N is calculated by determining the inverse of a modulo b. First, the value of $N_1$ is determined by:

$$N_1 = a^{-1} \bmod b \quad \text{(Equation 22)}$$

Starting with integer i=1, iterations of the following is performed by incrementing i.

$$N_i = iN_1 \bmod b \quad \text{(Equation 23)}$$

If $N_i < N_{max}$, the DFT size N is set to $N_{max}$, and the loop is broken. Otherwise, i is incremented, and the $N_i$ is recalculated for the new i value. Based on the determined N, the ADC parameter A is calculated by:

$$A = \frac{b}{gcd(a, gcd(N, b))} \quad \text{(Equation 24)}$$

The operating frequency $f_{op}$ collides with harmonics 1+A, 1+2A, 1+3A . . . . The sampling frequency $f_s$ is determined such that A is maximized from all possible ADC parameter A calculated above. After selecting the sampling frequency $f_s$, a discrete Fourier transform (DFT) size of N is selected to be the biggest multiple of b that is allowed. Based on the selected DFT size N, the first ADC 215 samples the output voltage Vout and collects N samples $\{a_0, a_1, \ldots, a_{N-1}\}$. The Fourier value c, the RMS amplitude $V_{RMS}$, and the phase $\theta$ are determined based on Equations 14, 15, and 16, respectively.

Figure 7:
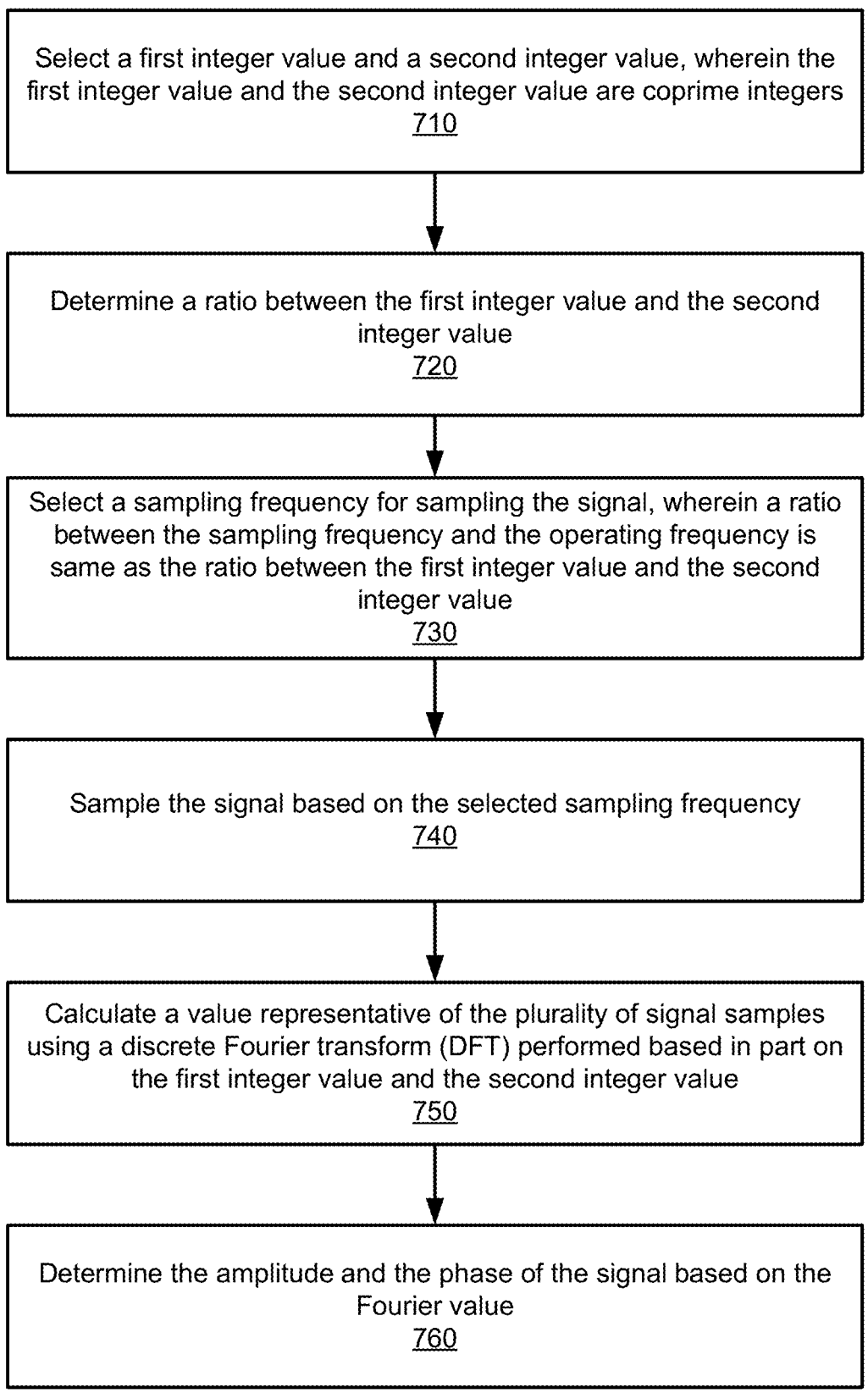
FIG. 7 is a flowchart illustrating a process of performing digital processing on samples of a signal from a coil, in accordance with an embodiment.

FIG. 7 is a flowchart illustrating a process of performing digital processing on samples of a signal from a coil, in accordance with an embodiment. A wireless charging system measures an amplitude and a phase of a signal of a coil driven at an operating frequency. The wireless charging system selects 710 a first integer value and a second integer value, where the first integer value and the second integer value are coprime integers. Based on the first integer value and the second integer value, the wireless charging system determines 720 a ratio between the first integer value and the second integer value. The wireless charging system selects 730 a sampling frequency for sampling the signal, where a ratio between the sampling frequency and the operating frequency is same as the ratio between the first integer value and the second integer value. After selecting the sampling frequency, the wireless charging system samples 740 the signal at the selected sampling frequency.

Example Communication Signal Demodulation System

The wireless charging system 100 demodulates communication signals from the receiver device 150A using the communication demodulation circuit 240. In some embodiments, the receiver device 150A communicates with the wireless charging system 100 according to Qi communication protocol. The communication demodulation circuit 240 allows the wireless charging system 100 to demodulate the communication signals despite noisy conditions and interferences from multiple receiver devices 150A being connected to the wireless charging system 100. Because the wireless charging system 100 may charge multiple receiver devices at the same time, accurate communication signal detection for each of the receiver devices is important for effectively charging the receiver devices 150A. The communication signal may encode characteristics of the receiver devices such as a state of charge in a battery, power required to successfully charge the receiver device, amount of power being received at the receiver device, erroneous state of the receiver, and cell voltage of the battery. The communication signal is provided to the PWM control system 205 as a feedback channel such that the PWM control system 205 may drive the coils 230 for charging the receiver devices 150A.

Figure 8:
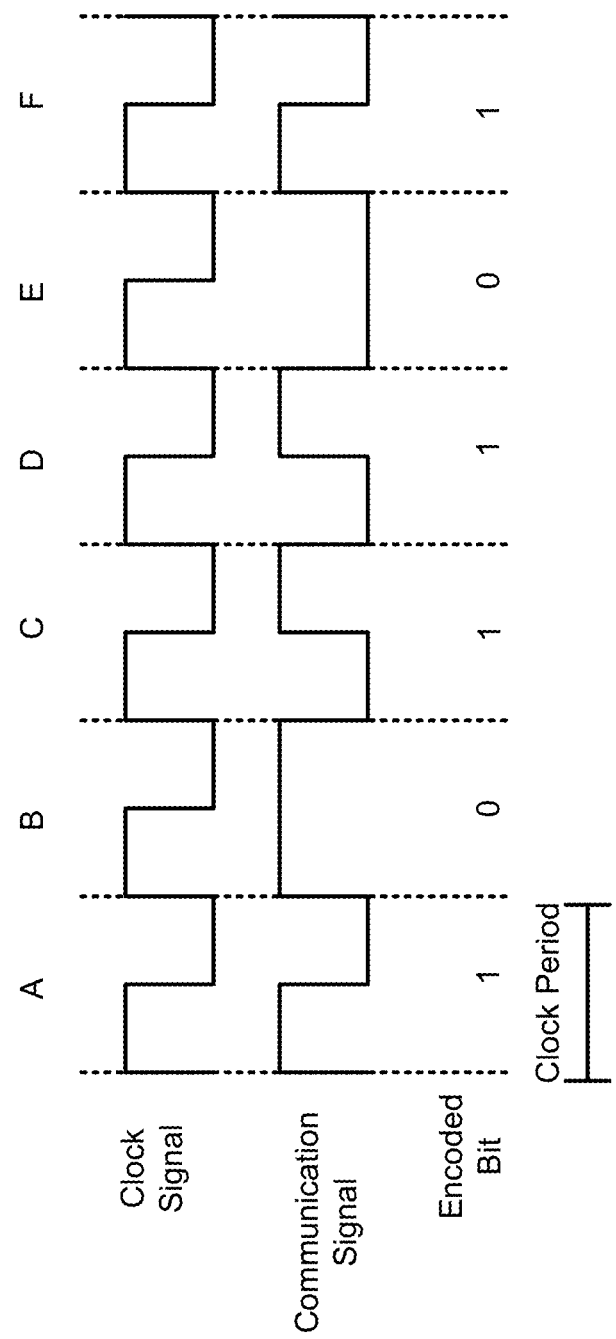
FIG. 8 is an example encoding of a communication signal in a receiver device, in accordance with an embodiment.

FIG. 8 is an example encoding of a communication signal in a receiver device, in accordance with an example embodiment. The receiver device 150A includes a switch that changes the load of the receiver device 150A depending on which state the switch is at (e.g., ON state or OFF state). Since the current in the coil 230 of the wireless charging system 100 is a function of the load of the receiver device 150A, the switch state of the receiver device 150A may be determined by analyzing the current in the coil 230. Communication signal can be transmitted by the receiver device 150A by encoding a message into a sequence of ON/OFF patterns using the switch. From the wireless charging system 100, the communication signal can be decoded by determining how the current in the coil 230 changes and mapping the changes to ON/OFF patterns.

The Qi communication protocol involves encoding zeros and ones using the state of the switch. Each clock period corresponds to a bit, and a number of transitions in the switch state during a clock period indicates the value of the bit. When there is one transition during a clock period, a bit corresponding to the clock period is encoded with a value of zero. Alternatively, when there are two transitions during the clock period, the bit is encoded with a value of one.

The activity in the receiver device 150A is synchronized according to a clock signal. The clock signal oscillates between a high state and a low state during each clock period. In some embodiments, each clock period corresponds to a duration of 0.5 ms. In other example embodiments, each clock period corresponds to a different time duration. The clock signal may be a square wave with a 50% duty cycle such that the clock signal is at the high state during 50% of a duration of each clock period.

The receiver device 150A encodes a plurality of bits into a communication signal that is synchronized with the clock signal. The receiver device 150A varies the state of the load switch between the ON state and the OFF state for encoding the bits. For example, during clock period A, the communication signal changes from the OFF state to the ON state at the beginning of the clock period and changes from the ON state to the OFF state at the middle of the clock period. Therefore, during clock period A, there is a total of two transitions, and the bit corresponding to the clock period A is encoded with a value of 1. During clock period B, the communication signal changes from the OFF state to the ON state at the beginning of the clock period and does not change during a remaining duration of the clock period. Since there is only one transition during clock period B, the bit corresponding to the clock period B is encoded with a value of 0. During clock period C, the communication signal changes from the ON state to the OFF state at the beginning of the clock period and changes from the OFF state to the ON state at the middle of the clock period. Since there are two transitions, the bit corresponding to the clock period C is encoded with a value of 1. The receiver device encodes the bits for each of the subsequent clock periods (e.g., clock periods D, E, F, and so on) according to the example encoding scheme described above.

Figure 9:
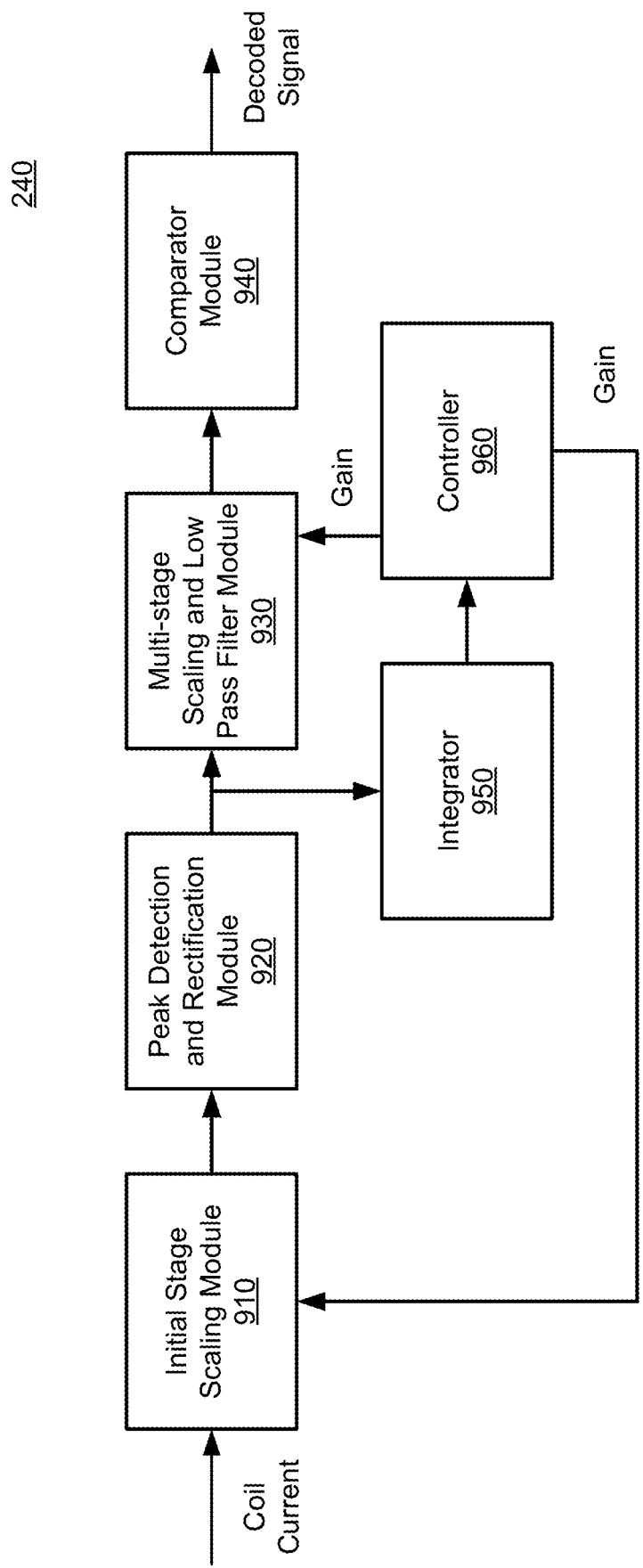
FIG. 9 is a block diagram of a circuit for demodulating a signal from a receiver device, in accordance with an embodiment.

FIG. 9 is a block diagram of a circuit for demodulating a signal from a receiver device 150A, in accordance with an embodiment. The receiver device 150A communicates with the wireless charging system 100 per Qi communication specification. Typical Qi communication demodulation methods rely on a charger with a fixed location for placing a receiver device such that the relative location between a pair of receiver device and a coil does not vary. Given the fixed location, a transfer function specific to the fixed location is applied to the received communication signal for decoding. However, the wireless charging system 100 allows charging of multiple receiver devices 150A which can cause communication signal distortion due to the different communication signals overlapping with each other. Additionally, the wireless charging system 100 allows the receiver devices 150A to be placed freely within a charging surface which can lead to poor alignment between the receiver devices 150A and the coils 130. Therefore, using typical Qi communication demodulation methods to decode the communication signals can result in inaccurate results.

The communication demodulation circuit 240 receives a coil current from the coil 230 that is coupled to the receiver device 150A. The communication demodulation circuit 240 demodulates the communication signal transmitted by the receiver device 150A from the coil current. Once the communication signal is demodulated, the communication signal may be used by the microcontroller 130 for charging the receiver device 150A. In some embodiments, the communication demodulation circuit 240 includes an initial stage scaling module 910, a peak detection and rectification module 920, a multi-stage scaling and low pass filter module 930, a compactor module 940, an integrator 950, and a controller 960.

The coil current includes two waves: a power supply wave for providing charging current to the receiver device 150A and a carrier wave including the Qi communication signal from the receiver device 150A. Because the carrier wave portion of the coil current carries the communication signal, it is useful to isolate the communication signals for communication demodulation. The power supply wave is significantly greater in amplitude compared to the carrier wave, and the communication demodulation circuit 240 performs a scaling operation separately for the power supply wave and the carrier wave. The communication demodulation circuit 240 may scale the power supply wave first using the initial stage scaling module 910 and pass the resulting signal to the peak detection and rectification module 920 to remove the power supply wave portion from the coil current such that further stages in the communication demodulation circuit 240 may focus on the carrier wave portion carrying the communication signal.

The communication demodulation circuit 240 may find the signal envelope at 2 kHz to recover the communication signal since the frequency of the communication signal from the receiver device 150A carrier wave is 2 kHz. After determining the envelope, the communication demodulation circuit 240 filters and scales the signal before passing the signal through a comparator to digitize the signal into a high state or a low state. Once the digital signal is determined, number of transitions during each of the clock periods can be determined to determine the communication signal.

The communication demodulation circuit 240 passes the coil current through the stage scaling module 910 that scales the amplitude of the coil current to be within a predetermined range. In particular, the stage scaling module 910 may scale the amplitude of the coil current to be appropriate for functions of the peak detection and rectification module 920. The stage scaling module 910 may use a differential circuit to adjust the midpoint of the coil current and the amplitude of the coil current. The gain used by the stage scaling module 910 is provided by the controller 960.

Once the stage scaling module 910 scales the coil current, the peak detection and rectification module 920 identifies peaks in the coil current and rectifies the coil current. The hysteresis of the peak detection and rectification module 920 is set such that the power supply wave is removed from the coil current and the carrier wave that carries the communication signals remains. After rectifying the wave in the coil current, the peak detection and rectification module 920 may filter out the DC bias to ensure that the signal is AC coupled.

The rectified coil current is then passed to a multi-stage scaling and low pass filter module 930. The multi-stage scaling and low pass filter module 930 further scales the coil current that was scaled by the initial stage scaling module 910. The coil signal that is passed to the multi-stage scaling and low pass filter module 930 is representative of the carrier wave, and the multi-stage scaling and low pass filter module 930 scales the carrier wave portion of the coil signal. Each of the scaling stages may have a configurable gain set by the controller 960. Because the amplitude of the coil is dynamic, it is difficult to select a fixed-gain without the risk of either saturating the op-amp in the initial stage scaling module 910 or the multi-stage scaling and low pass filter module 930 by exceeding its limits or missing small amplitudes. Therefore, instead of using a fixed-gain, the gain is dynamically determined by the controller 960. The rectified coil current is also passed to the integrator 950 that determines an average amplitude of the coil current. The average amplitude of the coil current is used as an input by the controller 960 that determines a gain for the stage scaling module 910 and the different stages in the multi-stage scaling and low pass filter module 930.

The multi-stage scaling and low pass filter module 930 also passes the coil current through a low pass filter to filter out high frequency signals above a threshold frequency to extract the communication signal from the coil current. In the coil current, the power supply wave may have a higher frequency compared to the carrier wave carrying the communication signal. For example, the power supply wave may correspond to a frequency of 100-150 kHz that is greater than the frequency of the communication signal at 2 kHz. The power supply wave gets filtered out by the low pass filter with a cut-off frequency of 10 kHz and the multi-stage scaling and low pass filter module 930 outputs a signal that represents just the communication signal generated by the receiver device 150A.

The comparator module 940 compares the signal output from the multi-stage scaling and low pass filter module 930 to a comparison value to digitize the communication signal included in the coil current. The comparator module 940 determines when the amplitude of the signal is below or equal to a comparison value and assigns a value of zero that represents a low state and when the amplitude of the signal is greater than the comparison value assigns a value of one that represents a high state. In some embodiments, the functions of the comparator module 940 may be performed by the second ADC 220 of the microcontroller 130, and the communication demodulation circuit 240 does not include the comparator module 940.

Example for Error Correction

In a conventional Qi standard signal processing procedure, a number of transition is determined for each clock period to determine a bit value of either a zero or a one. A conventional method for addressing errors in communication systems is to use an error correction code. However, because there is no such error correction code in Qi communication protocol, if there is an error in the decoding attempt while decoding a packet from a receiver device 150A using a typical Qi communication demodulation methods, the decoding of the packet fails and the packet is unrecoverable.

In some example embodiments, a parity bit may be added at the end of a byte (e.g., 8 bits) of communication signals by a receiver device 150A, to ensure that the byte has an odd number of 1's. When a packet including a plurality is transmitted by the receiver device 150A to the wireless charging device 100, there is a checksum at the end of each packet that is a bit-wise XOR of all the bytes in the packet. At the beginning of a packet, there is a header byte that identifies a type of packet. There is a finite selection of possible header bytes, and each header byte corresponds to a different type of packet.

The communication demodulation circuit 240 analyzes the coil current in the coil 230 and determines whether the communication signal from the receiver device 150A is at a low state or a high state at a given time. The communication signal is provided to the PWM control system 205 for decoding after passing through the communication demodulation circuit 240 and the second ADC 220. However, because of faulty hardware in the wireless charging system 100, noise in the wireless communication channel between the receiver device 150A and the wireless charging system 100, or interference between multiple receiver devices on the wireless charging system 100, spurious transitions may be introduced into the signal. To avoid being unable to recover packets, the microcontroller 130 may perform may perform error correction when decoding the communication signal from the signal output from the communication demodulation circuit 240.

In some embodiments, the spurious transitions can be detected when the microcontroller 130 decodes the bits in the transmission packets. When there are more than two transitions (e.g., the maximum number according to Qi protocol) in a single clock period, it means that there must be spurious transitions due to noise and interference. Therefore, error correction is required to remove the effects of the spurious transitions. If there are more than two transitions detected, an even number of transitions with a spacing of less than a threshold duration is removed. The threshold duration may be selected by observing spacings of spurious transitions and set to maximize error correction accuracy without introducing false positives. After removing the even number of transitions with spacing of less than a threshold duration, the corresponding bit is decoded with a value of 0 if there is one transition remaining and the corresponding bit is decoded with a value of 1 if there are two transitions remaining.

In some embodiments, the bit correction method may fail if even after removing an even number of transitions with a spacing of less than a threshold value, there is a number of transitions greater than 1. For each clock period in which the bit correction method fails, its corresponding bit is flagged as undecodable. After flagging a bit as being undecodable, the microcontroller 130 continues to decode subsequent bits that can be decoded and flag the bits that are undecodable.

After applying the decoding algorithm, there is a sequence of 0's, 1's, and undecodable bits for a packet, where the packet includes one or more bytes. An error correction algorithm may be applied to the sequence of decoded bits. The error correction algorithm may first use parity bits for recovering one or more undecodable bits at the byte level. As discussed above, there may be a parity bit at the end of each byte to ensure that there is an odd number of 1's in the byte. The error correction algorithm may recover as many undecodable bits as possible using the parity bit within a byte. For example, in a particular byte, if only one bit is flagged as being undecodable, the undecodable bit may be recovered using the parity bit. However, if there is more than one bit that is undecodable in a byte, the undecodable bits cannot be recovered using the parity bit. In this case, the undecodable bit is recovered at the packet level.

Each bit B (undecodable and decodable) corresponds to a byte index (e.g., i) within a packet and a bit index (e.g., j) within the byte. A bit B at the j-th bit of the i-th byte may be denoted as $B_{ij}$. Positions of a first bit may be denoted as $(i_1, j_1)$, a second bit as $(i_2, j_2)$, a third bit as $(i_3, j_3)$ and so forth such that the position of an m-th bit is denoted as $(i_m, j_m)$. Since there are N bytes in a packet, i may be 0, 1, 2, ..., N−1. In each byte there are 8 bits, so j may be 0, 1, 2, ..., 7. For each byte in a packet, there is a parity bit: $P_0$, $P_1$, $P_2$ ... $P_{N-1}$. There is also a checksum byte in the packet that represents a result of bit-wise XOR of all of the bytes in the packet such that the checksum byte includes a bit for each index $C_0, C_1, C_2 \ldots C_7$.

In some embodiments, some undecodable bits may recovered at the packet level using the checksum byte. As long as a pair of undecodable bits at $(i_a, j_a)$ and $(i_b, j_b)$ satisfy the condition of $j_a \neq j_b$, the undecodable bits may be recovered. That is, if the undecodable bits do not have the same bit index j within its respective byte, the bits may be decoded according to the following algorithm. For each undecodable bit at $(i_a, j_a)$, the bit $B_{ia\,jb}$ is set to $$B_{ia\,jb} = \Sigma_{i \neq i_a} B_{i\,ja} \oplus C_{ja} \qquad \text{(Equation 25)}$$

Once all of the undecodable bits that can be recovered is set to a value, the parity bit test and the checksum byte tests are performed. If all of the bits are consistent according to these tests, the PWM control system 205 determines that decoding has succeeded. If there is only one checksum bit $C_3$ and one parity bit $P_1$ that are inconsistent, the bit $B_{ij}$ is inverted (e.g., 0 to 1 or 1 to 0). If there are more than one checksum error and one parity bit error, the decoding algorithm fails. When the decoding algorithm fails, the corresponding packet may be dropped.

Figure 10:
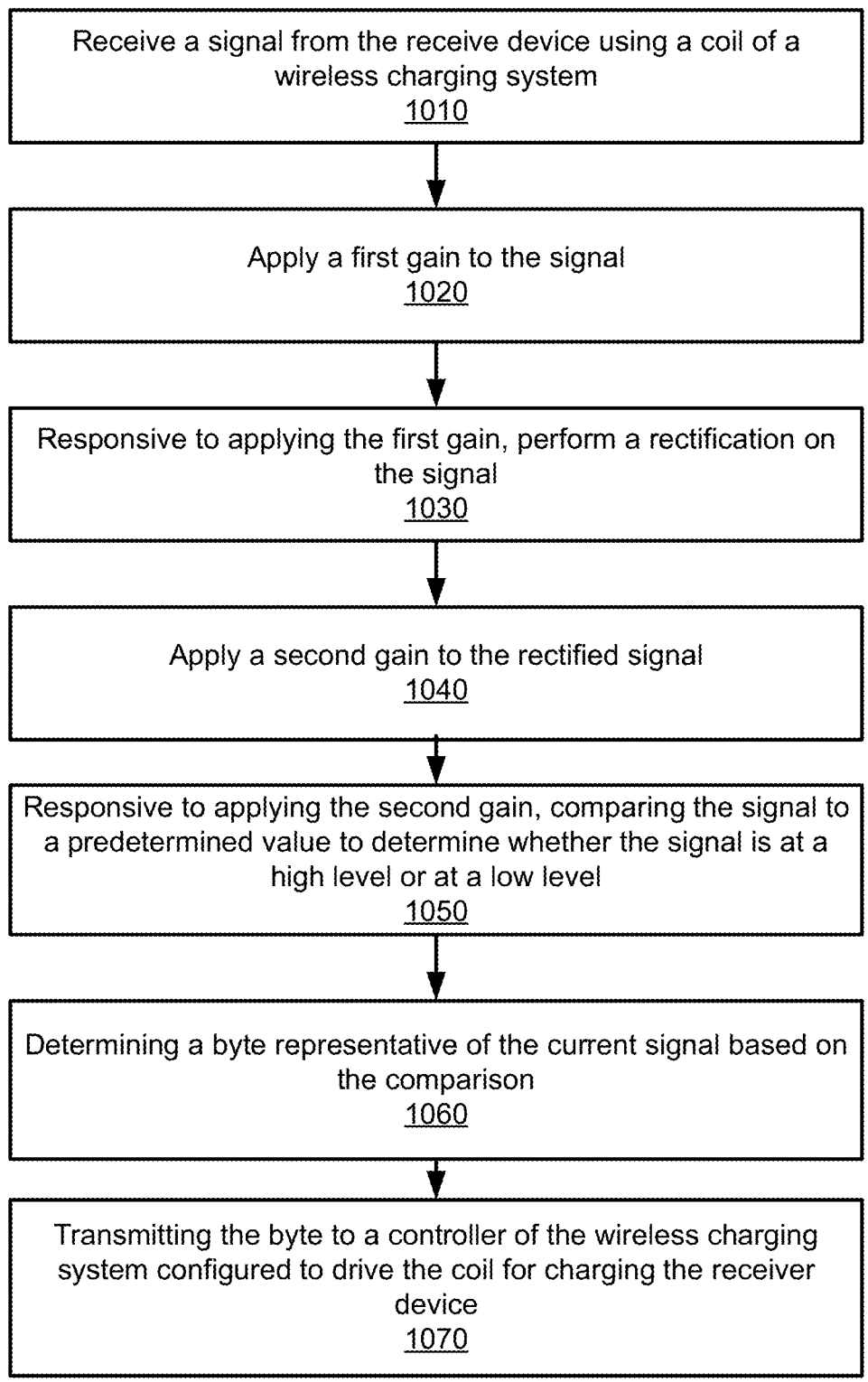
FIG. 10 is a flowchart illustrating a process of demodulating a signal from a receiver device, in accordance with an embodiment.

FIG. 10 is a flowchart illustrating a process of demodulating a signal from a receiver device, in accordance with an example embodiment. The wireless charging system receives 1010 the signal from the receive device using a coil. The wireless charging system applies 1020 a first gain to the signal. Responsive to applying the first gain, the wireless charging system performs 1030 a rectification on the signal. After the signal is rectified, the wireless charging system applies 1040 a second gain to the rectified signal. Responsive to applying the second gain, the wireless charging system compares 1050 the signal to a predetermined value to determine whether the signal is at a high level or at a low level. The wireless charging system determines 1060 a byte representation of the current signal based on the comparison. The wireless charging system transmits 1070 the byte to a controller of the wireless charging system configured to drive the coil for charging the receiver device.

Receiver Device Detection and Coil Selection

Figure 11:
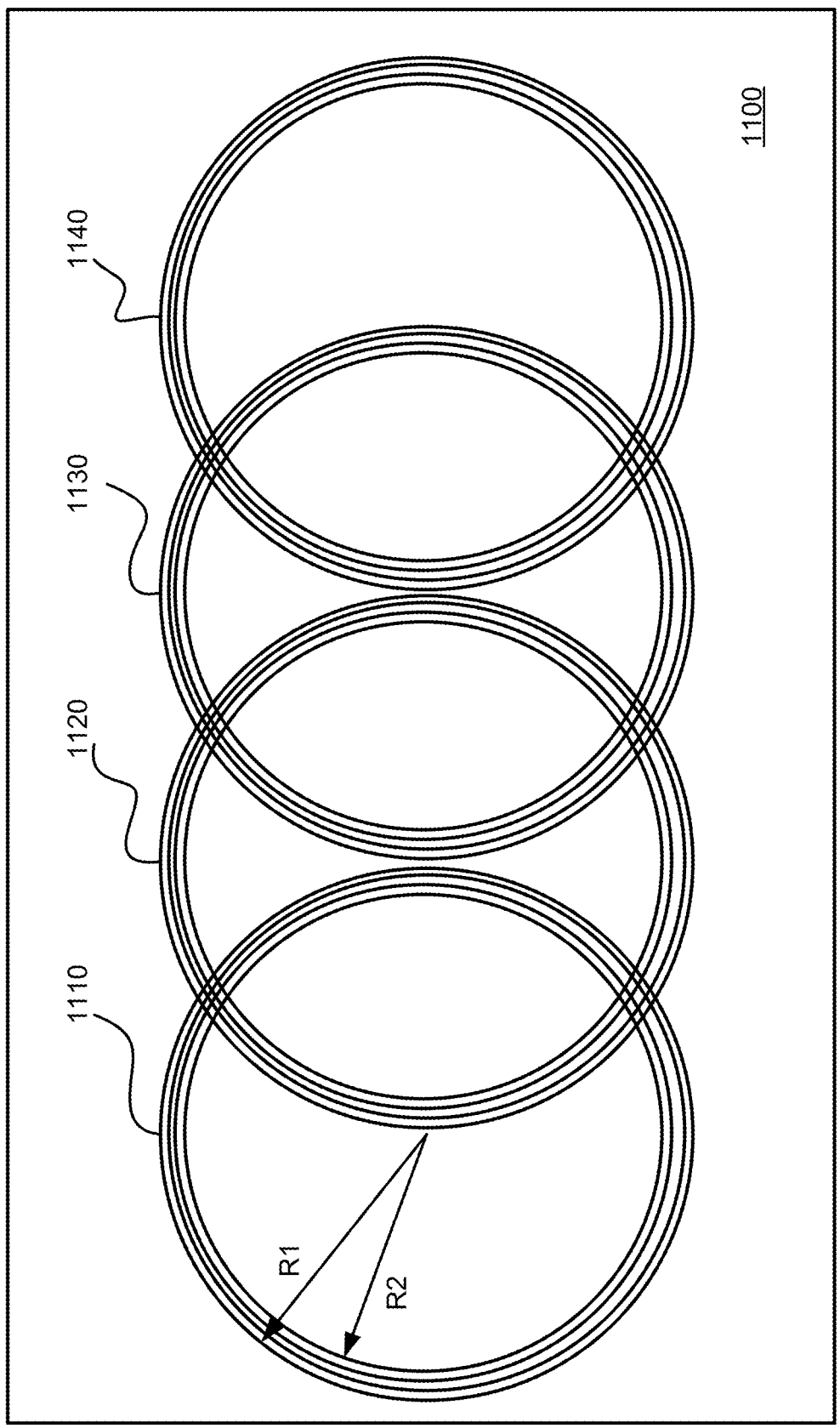
FIG. 11 is an example layout of multiple coils in a wireless charging system, in accordance with an embodiment.

FIG. 11 is an example layout 1100 of multiple coils in a wireless charging system, in accordance with an embodiment. In the example layout 1100, there are four overlapping coils that can be activated to charge multiple receiver devices 150A. In the example shown in FIG. 11, there are four coils, a first coil 1110, a second coil 1120, a third coil 1130, and a fourth coil 1140, that may be arranged in a horizontal plane. The layout 1100 can charge two receiver devices 150A simultaneously by activating different subsets of the coils depending on the positions of the receiver devices 150A. In other embodiments, there may be fewer or additional coils in the array of coils, relative position of overlapping coils may be different, size of the coils may vary. Based on the configuration of the coils in the wireless charging system, the wireless charging system may charge a different number of receiver devices 150A at a given time.

In some embodiments, each of the first coil 1110, the second coil 1120, the third coil 1130, and the fourth coil 1140 has an outer radius R1. The outer radius R1 of the coils may be selected to be large enough to charge receiver devices 150A within a threshold distance from the surface of the wireless charging system 100, but not so large that the metallic components of the receiver devices 150A become overheated during charging due to eddy currents.

Each of the first coil 1110, the second coil 1120, the third coil 1130, and the fourth coil 1140 has an inner radius R2 that is smaller than the outer radius R1. The inner radius R2 is selected such that it is large enough to ensure sufficiently large quality factor of the coils yet small enough such that there are enough loops in the coils to create sufficient field at the receiver devices 150A for charging efficiently.

In some embodiments, the first coil 1110, the second coil 1120, the third coil 1130, and the fourth coil 1140 are made of Litz wire with enough strands to mitigate loss due to skin effects and proximity effects and enough aggregate crosssectional area to carry driving current during charging. However, the wires cannot be too thick because it can reduce the number of loops in the coils and cause weaker field at the receiver devices 150A. For each of the coils, the leads of the coils may be twisted with each other, which could reduce noise due to electromagnetic interference.

In some embodiments, a relative spacing between two adjacent coils is equal to the outer radius R1. For example, as shown in FIG. 11, the distance between an outermost loop of the first coil 1110 and an outermost loop of the second coil 1120 is the same as the outer radius R1. When the spacing between two adjacent coils is equal to the outer radius R1, the field at the intersection of the two coils is strong enough to deliver designated power to a receiver device 150A when the receiver device 150A is positioned at the intersection. If two adjacent coils are disposed farther apart such that the relative spacing is greater than the outer radius R1, there can be a region on the charging surface of the wireless charging system 100 with a lower field intensity than what is required for charging the receiver device 150A. Additionally, when two adjacent coils are spaced apart at a distance equal to the outer radius R1, mutual coupling between adjacent coils can be minimized.

Resonant frequencies of the coils are chosen such that two closest coils that can be turned on simultaneously during charging have different resonant frequencies that are far apart and not harmonic frequencies of each other. This reduces mutual coupling (or cross-talk) between the coils, and even if there were residual mutual coupling, the effect of the mutual coupling is reduced.

In a typical way of identifying a receiver device 150A, a wireless charging system monitors current in a coil and determines that there is a receiver device on the wireless charging system once a change in the current is greater than a predefined threshold. More specifically, the wireless charging system may monitor one or more of current amplitude, current phase, offset of system resonant frequency, and quality factor and detect the receiver device based on change in the one or more factors. Responsive to determining that the change in the current is greater than the predefined threshold, the wireless charging system associates the coil to the detected receiver device.

However, this approach can have drawbacks in a wireless charging system with multiple coils. Since the multiple coils are coupled to each other, when a receiver device is placed on the wireless charging system, coils may erroneously be associated with the receiver device due to coupling with the coil that is most effective for power delivery to the receiver device. Activating incorrect subsets of coils can lead to lower charging efficiency and reliability in charging the receiver device. Additionally, it is difficult to determine a threshold value that is indicative of a receiver device given many factors that can affect the thresholds such as brand of the receiver device, model of the receiver device, battery level, distance between surface of the wireless charging system and the receiver device (e.g., due to thickness of protective receiver device cases or attachments to back of receiver device), and position of the receiver device with respect to the coils.

To avoid the threshold determination challenges, a supervised machine learning model may be used by the wireless charging system 100 to detect one or more receiver devices 150A and select a subset of coils for charging the devices based on the detection.

Figure 12:
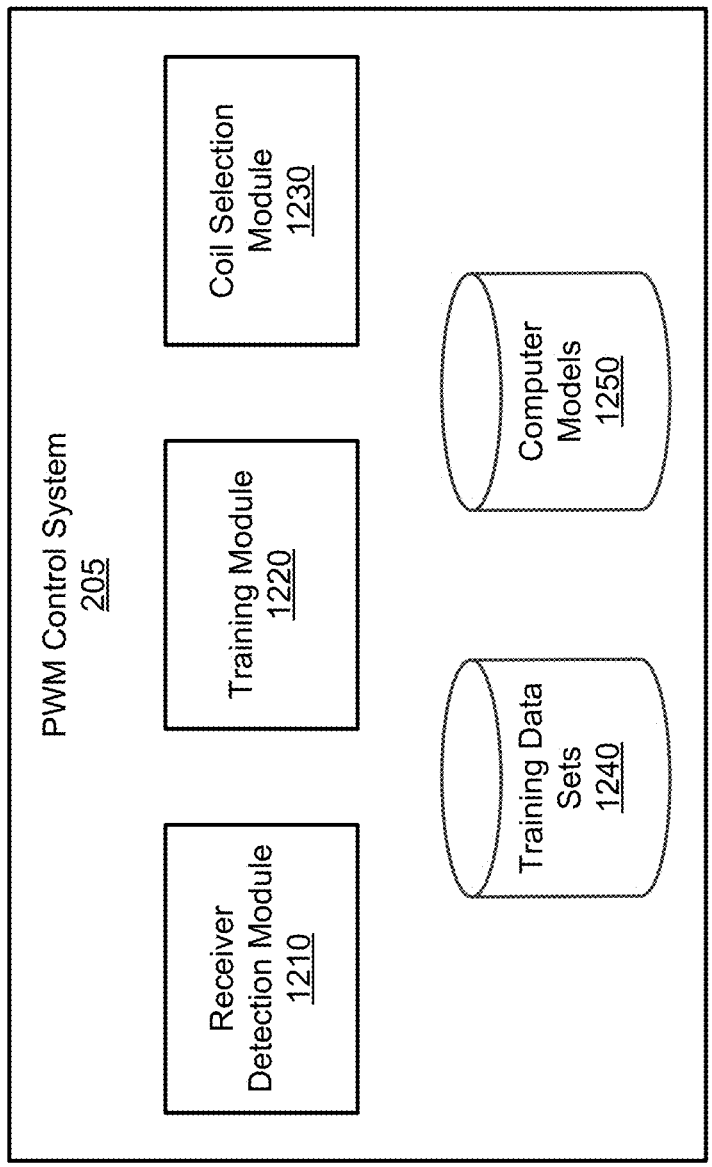
FIG. 12 is a block diagram of a pulse width modulation (PWM) control system, in accordance with an embodiment.

FIG. 12 is a block diagram of a pulse width modulation (PWM) control system, in accordance with an example embodiment. The PWM control system 205 includes a receiver detection module 1210, a training module 1220, a coil selection module 1230, a database of training data sets 1240, and a database of computer models 1250. In some embodiments, functionalities of one or more of the modules in the PWM control system 205 may be performed in a data cloud computing configuration or on a localized computer system configurations.

The receiver detection module 1210 receives signals from the coil measurement circuit 235 and signals from the communication demodulation circuit 240 and applies the trained computer models 1250 from the training module 1220 to the received signals to identify presence of receiver devices 150A.

In some embodiments, the receiver detection module 1210 uses a linear classifier such as a perceptron for each coil in the wireless charging system 100. The receive detection module 1210 receives an input data vector for each coil that is representative of a state of the coil. For each coil, a binary class is defined to determine whether a receiver device 150A is present on the wireless charging system 100 and the coil should be activated to charge the receiver device 150A or no receiver device 150A is present. The input data vectors provided to the classifier may be two dimensional vectors including a first dimension indicating a change in amplitude of current through the coil and a second dimension indicating a change in phase. The input data vectors may include other features such as voltage or may be represented in other ways. Both dimensions may be a signed (e.g., positive or negative) value. The output is a binary class where a first class indicates that a receiver device 150A is present on the wireless charging system 100 and the coil should be activated to charge the receiver device 150A and a second class indicates that a receiver device 150A is not present.

In some embodiments, the receiver detection module 1210 uses a non-linear classifier such as a support vector machine (SVM) for each coil in the wireless charging system 100. Similar to the linear classifier discussed above, for each coil, a binary class may be defined such that a first class corresponds to a receiver present on the wireless charging system 100 to be charged by the coil and a second class corresponds to no receiver present on the wireless charging system 100. The data vectors provided to the classifier may be two dimensional vectors. A first dimension may be a change in amplitude of current through the coil represented as a percentage and a second dimension may be a change in phase in degrees. Both dimensions may be a signed (e.g., positive or negative) value. The output is a binary class where a first class indicates that a receiver device 150A is present on the wireless charging system 100 and the coil should be activated to charge the receiver device 150A and a second class indicates that a receiver device 150A is not present.

In some embodiments, the receiver detection module 1210 uses a non-linear classifier such as a SVM for multiple coils. In comparison to having a different classifier for each of the multiple coils in the wireless charging system 100 and making a decision to activate the coils on a per-coil basis, a multi-coil classifier captures coupling between pairs of coils. This allows the wireless charging system 100 to consider the coils as a whole and select a subset of the coils using a more robust method compared to considering the coils individually and activating each of the coils that are identified by the individual classifiers.

In some embodiments, the wireless charging system 100 may be able to charge a maximum of two receiver devices 150A at the same time. In this case, the multi-coil classifier may be configured to identify a plurality of class types such as:

- No receiver device detected
- No previously detected receiver device and one new receiver device detected
- One previously detected receiver device and one new receiver device detected
- Two new receiver devices detected at the same time In other embodiments, the wireless charging system 100 may be able to charge a greater number of receiver devices 150A and the multi-coil classifier has additional classes.

Each type of class may contain multiple classes that corresponds a number of receiver devices, position of the receiver devices, and when the receiver devices are brought onto the wireless charging system 100. For example, for a wireless charging system 100 that includes four coils (coil 1, coil 2, coil 3, and coil 4) that can charge a maximum of two devices with a constraints that adjacent coils cannot be activated at the same time has fourteen classes:

| Class | Description |
|---|---|
| 1 | No receiver device |
| 2 | A new receiver device detected on coil 1 |
| 3 | A new receiver device detected on coil 2 |
| 4 | A new receiver device detected on coil 3 |
| 5 | A new receiver device detected on coil 4 |
| 6 | A new receiver device detected on coil 1 and a new receiver device detected on coil 3 |
| 7 | A new receiver device detected on coil 1 and a new receiver device detected on coil 4 |
| 8 | A new receiver device detected on coil 2 and a new receiver device detected on coil 4 |
| 9 | A previously detectected device on coil 1 and a new receiver device detected on coil 3 |
| 10 | A previously detectected device on coil 1 and a new receiver device detected on coil 4 |
| 11 | A previously detectected device on coil 2 and a new receiver device detected on coil 4 |
| 12 | A previously detectected device on coil 3 and a new receiver device detected on coil 1 |
| 13 | A previously detectected device on coil 4 and a new receiver device detected on coil 1 |
| 14 | A previously detectected device on coil 4 and a new receiver device detected on coil 2 |

In some embodiments, the input data vector provided to the receiver detection module 1210 is a concatenation of data vectors from each of the plurality of coils in the wireless charging system 100. For each coil, a data vector may include a first dimension that represents a change in amplitude of current through the coil represented as a percentage and a second dimension that represents a change in phase in degrees. For example, the concatenated data vector for the example with four coils has eight dimensions: change in current amplitude for coil 1, change in current phase for coil 1, change in current amplitude for coil 2, change in current phase for coil 2, change in current amplitude for coil 3, change in current phase for coil 3, change in current amplitude for coil 4, and change in current phase for coil 4. For coils that are already associated with a previously detected device, the data corresponding to these coils may automatically set to 0.

The training module 1220 trains the computer models 1250 using the training data sets 1240. The training data sets 1240 include pairs of input data vector and desired output of charging configuration. During the training process, the training module 1220 repeatedly updates a set of parameters for the computer models 1250 based on the provided pairs of input data vector and desired charging configuration. The training data sets 1240 may be labeled or annotated by human operators.

During training, the training module 1220 performs iterations of applying the computer models 1250 to a pair of input data vector and desired charging configuration. Based on the computer models 1250, the training module 1220 determines an estimated charging configuration. The training module 1220 determines a difference between the estimated charging configuration and the desired charging configuration associated with the input data vector and updates the set of parameters of the computer models 1250 to reduce the difference.

The coil selection module 1230 selects one or more coils to activate to charge receiver devices detected by the receiver detection module 1210. After the receiver detection module 1210 determines the class, the coil selection module 1230 uses the identified class to determine which subset of the coils to drive for charging the detected one or more devices. The PWM control system 205 may use the subset information in combination with demodulated communication signal from the second ADC 220 to drive the subset of the coils.

Figure 13:
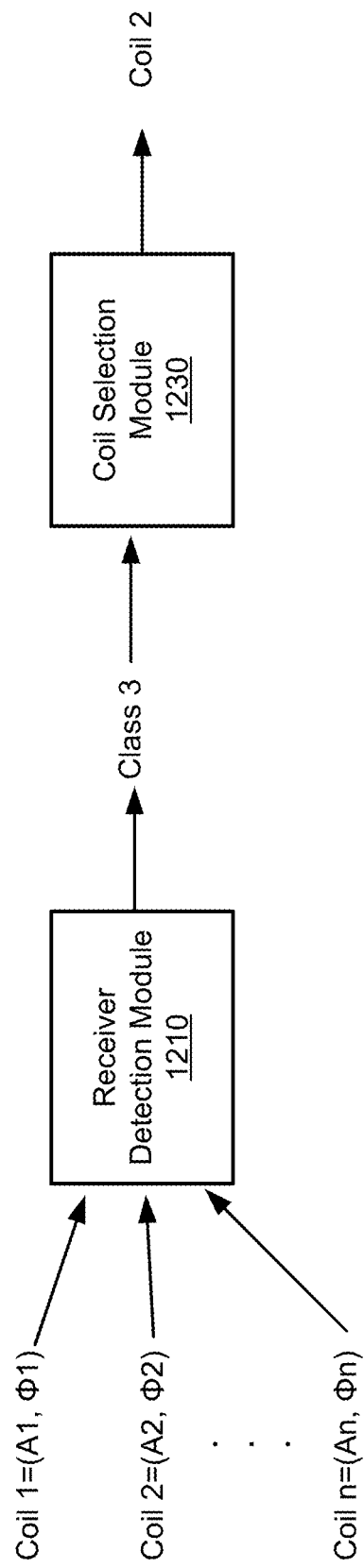
FIG. 13 illustrates an example process of deploying a classification model for receiver device detection, in accordance with an embodiment.

FIG. 13 illustrates an example process of deploying a classification model for receiver device detection, in accordance with an embodiment. The example process shown in FIG. 13 corresponds to an embodiment in which a classifier used by the receiver detection module 1210 is a multi-coil classifier that determines a class based on states of all of the coils in the wireless charging system 100. The receiver detection module 1210 receives an input data vector that represents states of all of the coils (e.g., coil 1, coil 2 . . . coil n) in the wireless charging system 100. In some embodiments, each coil corresponds to a data vector that includes two dimensions: change in amplitude of current through the coil and change in phase of current through the coil. The change in amplitude and the change in phase may be represented as percentages, absolute values, signed values, and such. Each coil may correspond to additional or different types of characteristics such as change in amplitude of voltage across a coil, change in phase in amplitude of voltage across a coil, and such.

For the multi-coil classifier, the input data vector may be a single vector that is a concatenation of all of the data vectors for all of the coils. The receiver detection module 1210 retrieves and applies computer models 1250 to classify the input data vector into a class (e.g., class 3). In one example, class 3 may correspond to a case in which a new receiver device detected on coil 2. Using the identified class, the coil selection module 1230 may select coil 2 to be activated for charging the newly detected receiver device.

In other embodiments, the receiver detection module 1210 may use a plurality of classifiers, each classifier corresponding to a coil. The receive detection module 1210 may receive a plurality of data vectors where each data vector is an input to one classifier with a binary class such as a perceptron or a SVM. The receiver detection module

1210 may output a class for each coil such that if there are n coils in the wireless charging system 100, the receiver detection module 1210 identifies n classes that each corresponds to a different coil. Based on the class, the coil selection module 1230 determines whether to activate the coils on a per-coil basis.

Figure 14:
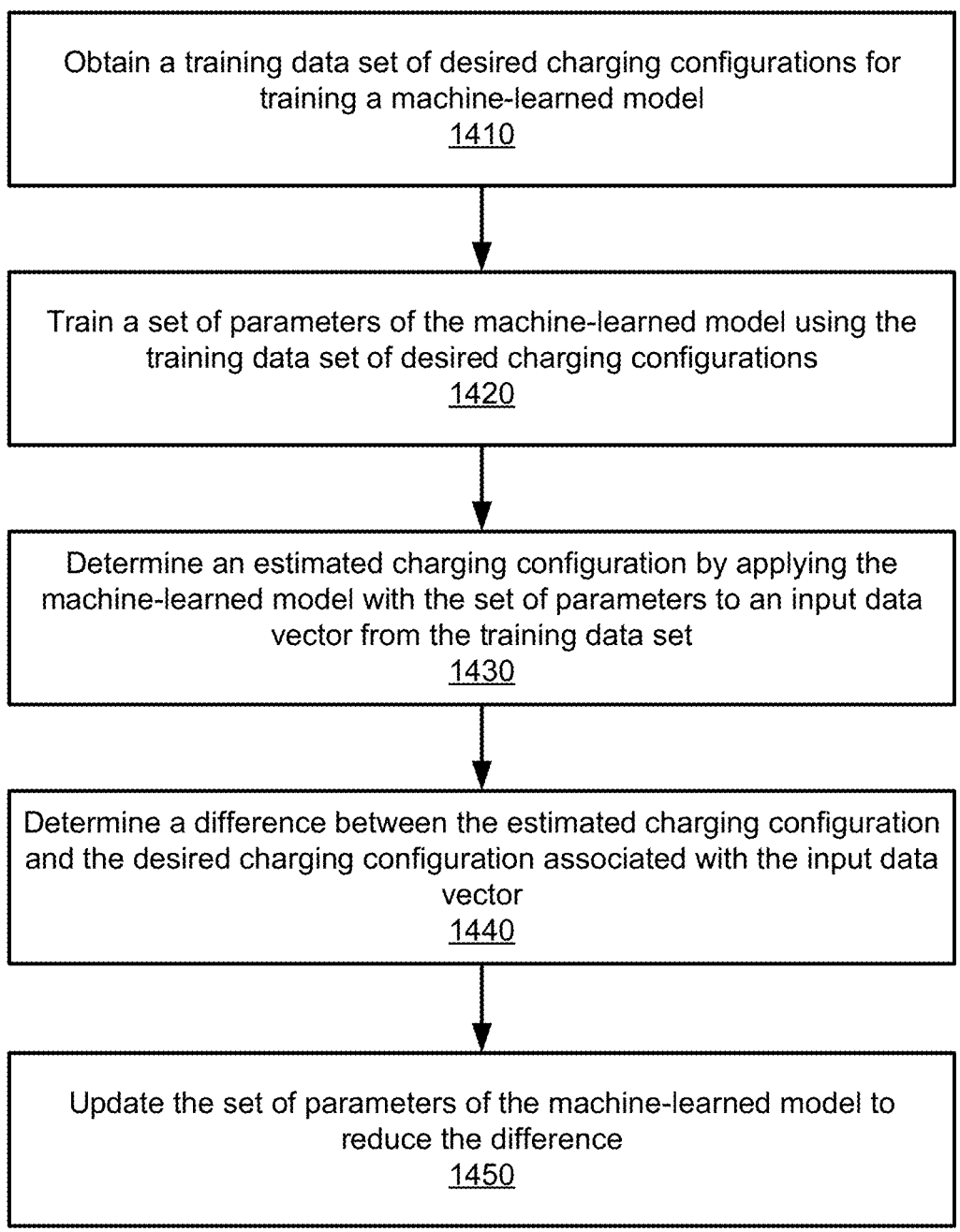
FIG. 14 illustrate a flowchart illustrating a process of training a machine-learned model, in accordance with an embodiment.

FIG. 14 illustrate a flowchart illustrating a process of training a machine-learned model, in accordance with an embodiment. The machine-learned model is configured to detect one or more receiver devices on a charging surface of a wireless charging system and output a subset from a plurality of coils in the wireless charging system for charging the one or more receiver devices. A computer obtains 1410 a training data set of desired charging configurations, the training data set includes a plurality of input data vectors associated with signals from the plurality of coils of the wireless charging system and a corresponding plurality of desired charging configuration that includes subsets of coils to be activated. The computer trains 1420 a set of parameters of the machine-learned model using the training data set of desired charging configurations. During an iteration of the training process, the computer determines 1430 an estimated charging configuration by applying the machine-learned model with a set of parameters to an input data vector from the training data set. Based on the estimated charging configuration, the computer determines 1440 a difference between the estimated charging configuration and the desired charging configuration associated with the input data vector. The computer updates 1450 the set of parameters of the machine-learned model to reduce the difference.

Additional Configuration Considerations

In an embodiment, a wireless charging system may use a simple circuit structure such as a half-bridge inverter or a full-bridge inverter in a coil drive circuit for driving a coil. The simple circuit structure in the coil drive circuit reduces circuit complexity and cost of the wireless charging system. Despite using a simple circuit structure, the wireless charging system may achieve a wide range and flexibility in generating coil drive signals by selecting the appropriate pulse width modulation (PWM) signals that is provided as an input to generate the coil drive signals.

In an embodiment, a wireless charging system may use a low-speed analog to digital converter (ADC) to measure high-speed signals from the coils. The ADC may have a maximum sampling speed that is lower than what is necessary to accurately measure high-speed signals from the coils. However, using the digital processing methods discussed in the present disclosure, the wireless charging system may accurately reconstruct amplitude and phase of the high-speed signals despite the limitations of the ADC.

In an embodiment, a wireless charging system may demodulate communication signals using a circuit with automatic gain control. Current through the coils in the wireless charging system is a function of load controlled by a switch in the receiver devices, and by decoding patterns in the current corresponding to ON/OFF patterns of the switch, the wireless charging system can recover communication signals from the receiver devices. Because the current through the coils is dynamic, the automatic gain control in the communication demodulation circuit improves decoding accuracy. Further, the wireless charging system may process the decoded signal for error correction at a bit-level and a packet-level.

In an embodiment, a wireless charging system may use machine learning to detect receiver devices on a charging surface of the wireless charging system and select a charging configuration. The wireless charging system may allow the receiver devices to be placed at any location within the charging surface. Because a various number of receiver devices may be charged and may be placed at different positions for different charging sessions, it is difficult to analytically model interactions between a plurality of coils in the wireless charging system and a plurality of receiver devices. However, using a machine learning model to identify an appropriate charging configuration allows for effective wireless power delivery to the receiver devices for different device placements.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for wireless charging through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method of training a machine-learned model configured to detect one or more receiver devices on a charging surface of a wireless charging system and output a subset from a plurality of coils of the wireless charging system for charging the one or more receiver devices comprising:
   obtaining a training data set of desired charging configurations, the training data set includes a plurality of input data vectors associated with signals from the plurality of coils of the wireless charging system and a corresponding plurality of desired charging configurations that includes subsets of coils to be activated; and
   training a set of parameters of the machine-learned model using the training data set of desired charging configurations, the training comprising repeatedly performing iterations of:
      determining an estimated charging configuration by applying the machine-learned model with a set of parameters to an input data vector from the training data set,
      determining a difference between the estimated charging configuration and the desired charging configuration associated with the input data vector, and
      updating the set of parameters of the machine-learned model to reduce the difference between the estimated charging configuration and the desired charging configuration associated with the input data vector.

2. The computer-implemented method of claim 1, wherein the signals from the plurality of coils of the wireless charging system are based on a position of one or more receiver devices on the wireless charging system.

3. The computer-implemented method of claim 1, wherein the data vector is a concatenation of data from each of the plurality of coils of the wireless charging system.

4. The computer-implemented method of claim 3, wherein the data vector includes a percentage of amplitude change in a current signal of each of the plurality of coils.

5. The computer-implemented method of claim 3, wherein the data vectors includes a phase change in a current signal of each of the plurality of coils.

6. The computer-implemented method of claim 1, wherein the plurality of coils of the wireless charging system are arranged in an array such that adjacent coils in the array overlap each other.

7. The computer-implemented method of claim 6, wherein a distance between a first coil and a second coil adjacent to the first coil is equal to an outer radius of the first coil and the second coil.

8. A non-transitory computer-readable storage medium storing computer program instructions executable to perform operations for training a machine-learned model configured to detect one or more receiver devices on a charging surface of a wireless charging system and output a subset from a plurality of coils of the wireless charging system for charging the one or more receiver devices, the operations comprising:
   obtaining a training data set of desired charging configurations, the training data set includes a plurality of input data vectors associated with signals from the plurality of coils of the wireless charging system and a corresponding plurality of desired charging configurations that includes subsets of coils to be activated; and
   training a set of parameters of the machine-learned model using the training data set of desired charging configurations, the training comprising repeatedly performing iterations of:
      determining an estimated charging configuration by applying the machine-learned model with the set of parameters to an input data vector from the training data set,
      determining a difference between the estimated charging configuration and the desired charging configuration associated with the input data vector, and
      updating the set of parameters of the machine-learned model to reduce the difference between the estimated charging configuration and the desired charging configuration associated with the input data vector.

9. The computer-readable storage medium of claim 8, wherein the signals from the plurality of coils of the wireless charging system are based on a position of one or more receiver devices on the wireless charging system.

10. The computer-readable storage medium of claim 8, wherein the data vector is a concatenation of data from each of the plurality of coils of the wireless charging system.

11. The computer-readable storage medium of claim 10, wherein the data vector includes a percentage of amplitude change in a current signal of each of the plurality coils.

12. The computer-readable storage medium of claim 10, wherein the data vectors includes a phase change in a current signal of each of the plurality of coils.

13. The computer-readable storage medium of claim 8, wherein the plurality of coils of the wireless charging system are arranged in an array such that adjacent coils in the array overlap each other.

14. The computer-readable storage medium of claim 13, wherein a distance between a first coil and a second coil adjacent to the first coil is equal to an outer radius of the first coil and the second coil.

15. A system comprising:
   a processor; and
   a non-transitory computer-readable medium comprising computer program instructions that when executed by the processor of an online system causes the processor to perform steps comprising:
      obtaining a training data set of desired charging configurations, the training data set includes a plurality of input data vectors associated with signals from the plurality of coils of the wireless charging system and a corresponding plurality of desired charging configurations that includes subsets of coils to be activated; and
      training a set of parameters of the machine-learned model using the training data set of desired charging configurations, the training comprising repeatedly performing iterations of:
         determining an estimated charging configuration by applying the machine-learned model with the set of parameters to an input data vector from the training data set, determining a difference between the estimated charging configuration and the desired charging configuration associated with the input data vector, and updating the set of parameters of the machine-learned model to reduce the difference between the estimated charging configuration and the desired charging configuration associated with the input data vector.

16. The system of claim 15, wherein the signals from the plurality of coils of the wireless charging system are based on a position of one or more receiver devices on the wireless charging system.

17. The system of claim 15, wherein the data vector is a concatenation of data from each of the plurality of coils of the wireless charging system.

18. The system of claim 17, wherein the data vector includes a percentage of amplitude change in a current signal of each of the plurality of coils.

19. The system of claim 17, wherein the data vectors includes a phase change in a current signal of each of the plurality of coils.

20. The system of claim 17, wherein resonant frequencies of the plurality of coils of the wireless charging system are selected to minimize mutual coupling between coils.

* * * * *